(12) United States Patent
Ting et al.

(10) Patent No.: US 11,164,944 B2
(45) Date of Patent: Nov. 2, 2021

(54) METHOD OF MANUFACTURING A SEMICONDUCTOR DEVICE

(71) Applicant: Taiwan Semiconductor Manufacturing Company, Ltd., Hsinchu (TW)

(72) Inventors: Heng-Wen Ting, Pingtung (TW); Hsueh-Chang Sung, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/543,029

(22) Filed: Aug. 16, 2019

(65) Prior Publication Data

US 2020/0176565 A1   Jun. 4, 2020

Related U.S. Application Data

(60) Provisional application No. 62/773,542, filed on Nov. 30, 2018.

(51) Int. Cl.
*H01L 29/08* (2006.01)
*H01L 29/66* (2006.01)
*H01L 29/78* (2006.01)
*H01L 21/02* (2006.01)

(52) U.S. Cl.
CPC .... *H01L 29/0847* (2013.01); *H01L 21/02532* (2013.01); *H01L 29/66795* (2013.01); *H01L 29/785* (2013.01)

(58) Field of Classification Search
CPC .............. H01L 29/0847; H01L 21/02532
See application file for complete search history.

(56) References Cited

U.S. PATENT DOCUMENTS

| | | | |
|---|---|---|---|
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,576,814 B2 | 2/2017 | Wu et al. |
| 9,608,116 B2 | 3/2017 | Ching et al. |
| 9,812,363 B1 | 11/2017 | Liao et al. |

(Continued)

*Primary Examiner* — Jay C Chang
*Assistant Examiner* — Mikka Liu
(74) *Attorney, Agent, or Firm* — Slater Matsil, LLP

(57) ABSTRACT

A semiconductor device having an improved source/drain region profile and a method for forming the same are disclosed. In an embodiment, a method includes etching a semiconductor fin to form a first recess; and forming a source/drain region in the first recess, forming the source/drain region including epitaxially growing a first semiconductor material in the first recess, the first semiconductor material being silicon; epitaxially growing a second semiconductor material over the first semiconductor material, the second semiconductor material including silicon germanium; and epitaxially growing a third semiconductor material over the second semiconductor material, and the third semiconductor material having a germanium concentration from 60 to 80 atomic percent, the third semiconductor material having a germanium concentration greater than the germanium concentration of the second semiconductor material.

20 Claims, 26 Drawing Sheets

(56) References Cited

U.S. PATENT DOCUMENTS 9,859,380 B2 1/2018 Lee et al.
2016/0027918 A1* 1/2016 Kim .................... H01L 29/7834
 257/401
2018/0286861 A1* 10/2018 Choi ................... H01L 27/0924

* cited by examiner

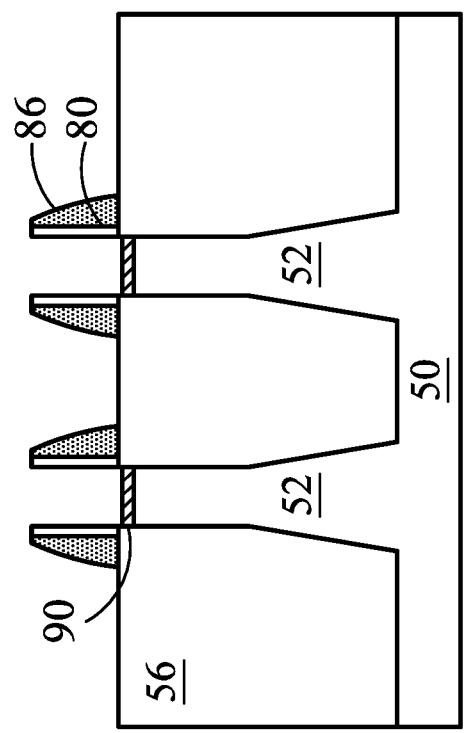
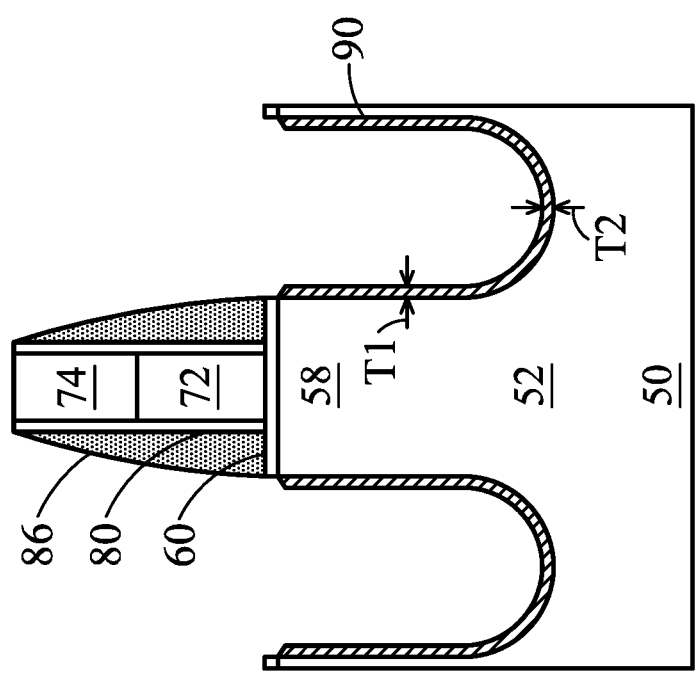
Figure 11A
Figure 11B

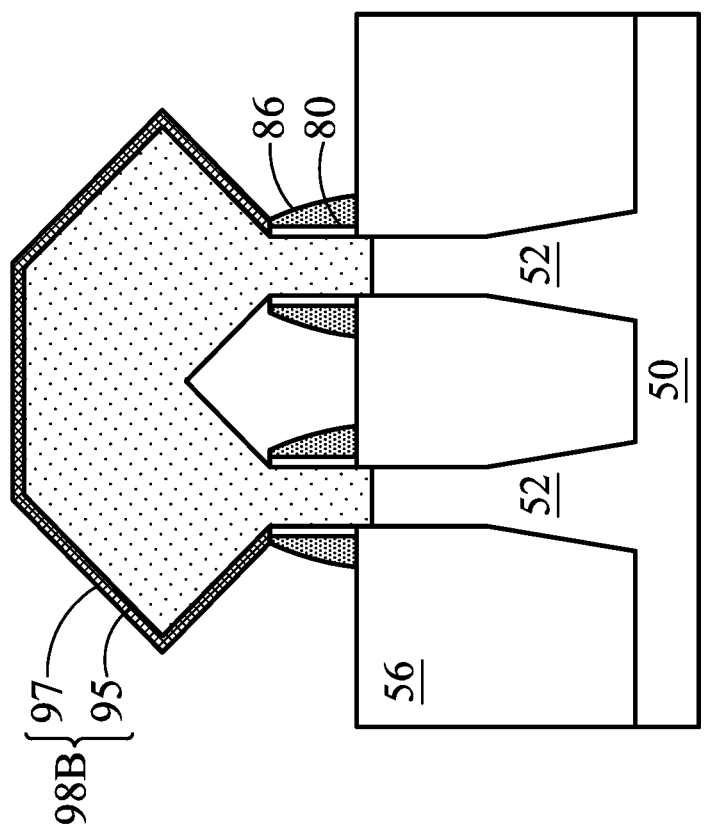
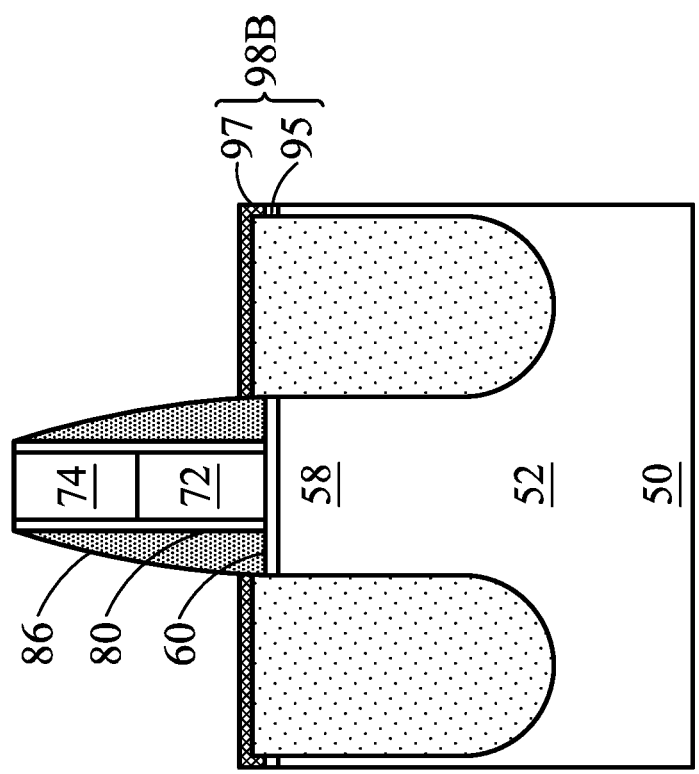
Figure 15A
Figure 15B

METHOD OF MANUFACTURING A SEMICONDUCTOR DEVICE

PRIORITY CLAIM AND CROSS-REFERENCE

This application claims the benefit of U.S. Provisional Application No. 62/773,542, filed on Nov. 30, 2018, entitled "Semiconductor Device and Method of Manufacture," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-21C illustrate various cross-sectional and perspective views of a formation of a FinFET, in accordance with some embodiments.

DETAILED DESCRIPTION

Figure 1:
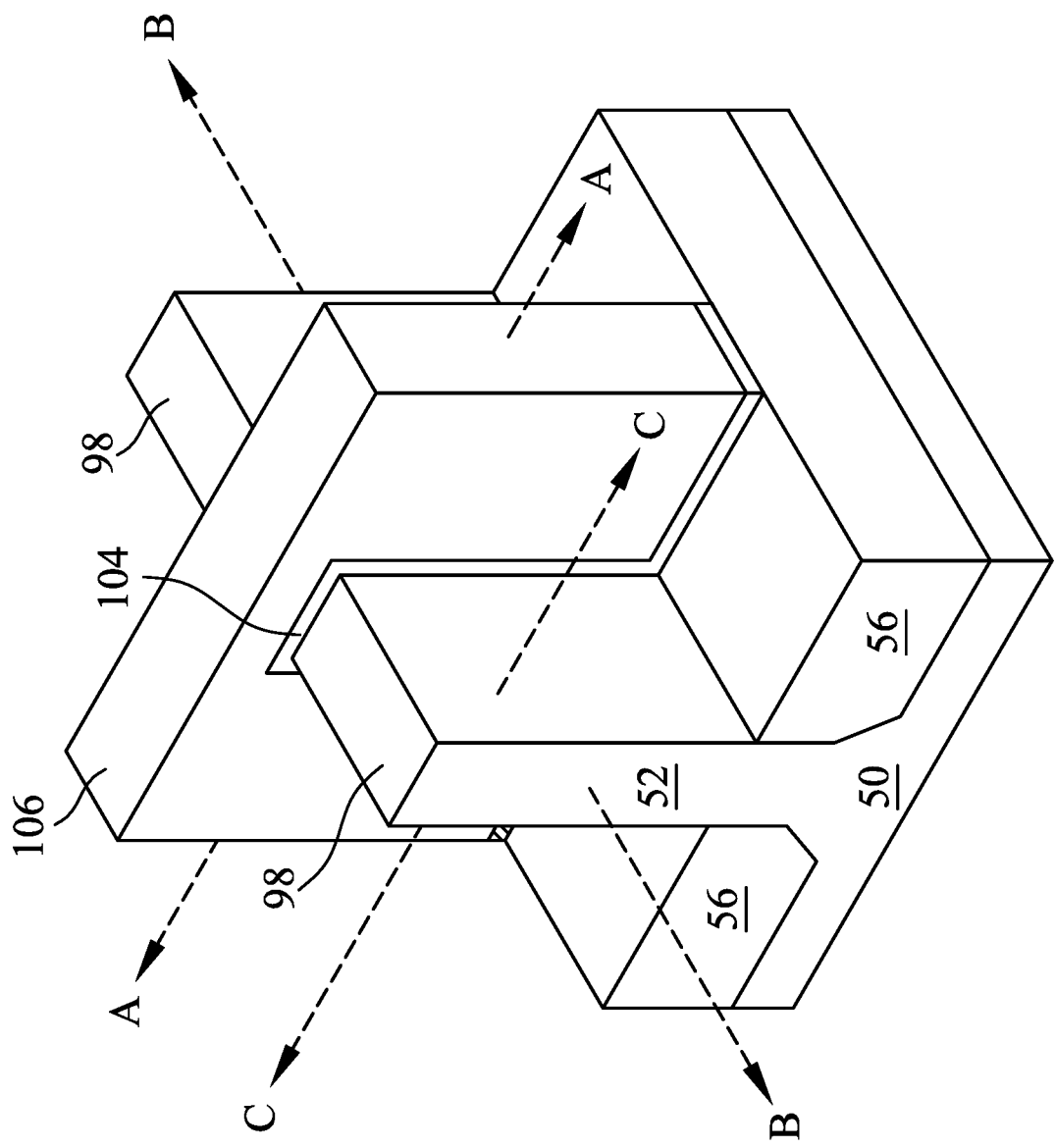

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for forming source/drain regions having decreased source/drain resistance ($R_{sd}$), decreased contact resistance ($R_{csd}$), decreased channel resistance ($R_{ch}$), decreased overlap resistance ($R_{ov}$), and improved device performance. The source/drain regions may be formed by epitaxially growing a first source/drain layer in a recess formed in a semiconductor fin, epitaxially growing a second source/drain layer over the first source/drain layer, and epitaxially growing a third source/drain layer over the second source/drain layer.

A material having high dopant out-diffusion may be used for the first source/drain layer, which may decrease overlap resistance ($R_{ov}$). For example, the first source/drain layer may be formed of boron-doped silicon having a boron dopant concentration greater than $1 \times 10^{20}$ atoms/cm$^3$. A material having low resistivity and exerting high strain may be used for the third source/drain layer, which may decrease source/drain resistance ($R_{sd}$), contact resistance ($R_{csd}$), and channel resistance ($R_{ch}$). For example, the third source/drain layer may be formed of boron-doped silicon germanium having a germanium concentration from about 60 percent to about 80 percent and a boron concentration greater than about $6 \times 10^{20}$ atoms/cm$^3$ or greater than about $8 \times 10^{20}$ atoms/cm$^3$. The second source/drain layer may be a buffer layer between the first source/drain layer and the third source/drain layer. The second source/drain layer may be formed of boron-doped silicon germanium having a germanium concentration from about 20 percent to about 60 percent and a boron concentration greater than about $5 \times 10^{20}$ atoms/cm$^3$.

The overall resistance of the source/drain regions may be further decreased and the device performance further improved by decreasing the thicknesses/volumes of the first source/drain layer and the second source/drain layer and increasing the thickness/volume of the third source/drain layer. For example, the first source/drain layer may have a thickness ranging from about 1 nm to about 10 nm, the second source/drain layer may have a thickness less than about 30 nm or less than about 25 nm, and the third source/drain layer may have a thickness greater than about 20 nm.

FIG. 1 illustrates an example of a FinFET in a three-dimensional view, in accordance with some embodiments. The FinFET comprises a fin 52 on a substrate 50 (e.g., a semiconductor substrate). Shallow trench isolation (STI) regions 56 are disposed in the substrate 50, and the fin 52 protrudes above and from between neighboring STI regions 56. Although the STI regions 56 are described/illustrated as being separate from the substrate 50, as used herein the term "substrate" may be used to refer to just the substrate 50 or the substrate 50 inclusive of the STI regions 56. Additionally, although the fin 52 and the substrate 50 are illustrated as a single, continuous material, the fin 52 and/or the substrate 50 may comprise a single material or a plurality of materials. In this context, the fin 52 refers to the portion extending between the neighboring STI regions 56.

A gate dielectric layer 104 is along sidewalls and over a top surface of the fin 52, and a gate electrode 106 is over the gate dielectric layer 104. Source/drain regions 98 are disposed in opposite sides of the fin 52 with respect to the gate dielectric layer 104 and gate electrode 106. FIG. 1 further illustrates reference cross-sections that are used in later figures. Cross-section A-A is along a longitudinal axis of the gate electrode 106 and in a direction, for example, perpendicular to the direction of current flow between the source/drain regions 98 of the FinFET. Cross-section B-B is perpendicular to cross-section A-A and is along a longitudinal axis of the fin 52 and in a direction of, for example, a current flow between the source/drain regions 98 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs. As an example, the FETs discussed herein may be used in a ring-oscillator device.

FIGS. 2 through 21C are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 16A, 17A, 18A, 19A, 20A, and 21A are illustrated along reference cross-section A-A illustrated in FIG. 1, and FIGS. 8B, 9B, 10B, 11A, 12A, 13A, 14A, 15A, 16B, 17B, 18B, 19B, 19C, 20B, and 21B are illustrated along a similar cross-section B-B illustrated in FIG. 1, except for multiple fins/FinFETs. FIGS. 10C, 11B, 12B, 13B, 14B, 14C, and 21C are illustrated along reference cross-section C-C illustrated in FIG. 1 in a PMOS region and FIGS. 15B and 15C are illustrated along reference cross-section C-C illustrated in FIG. 1 in an NMOS region, except for multiple fins/FinFETs.

Figure 2:
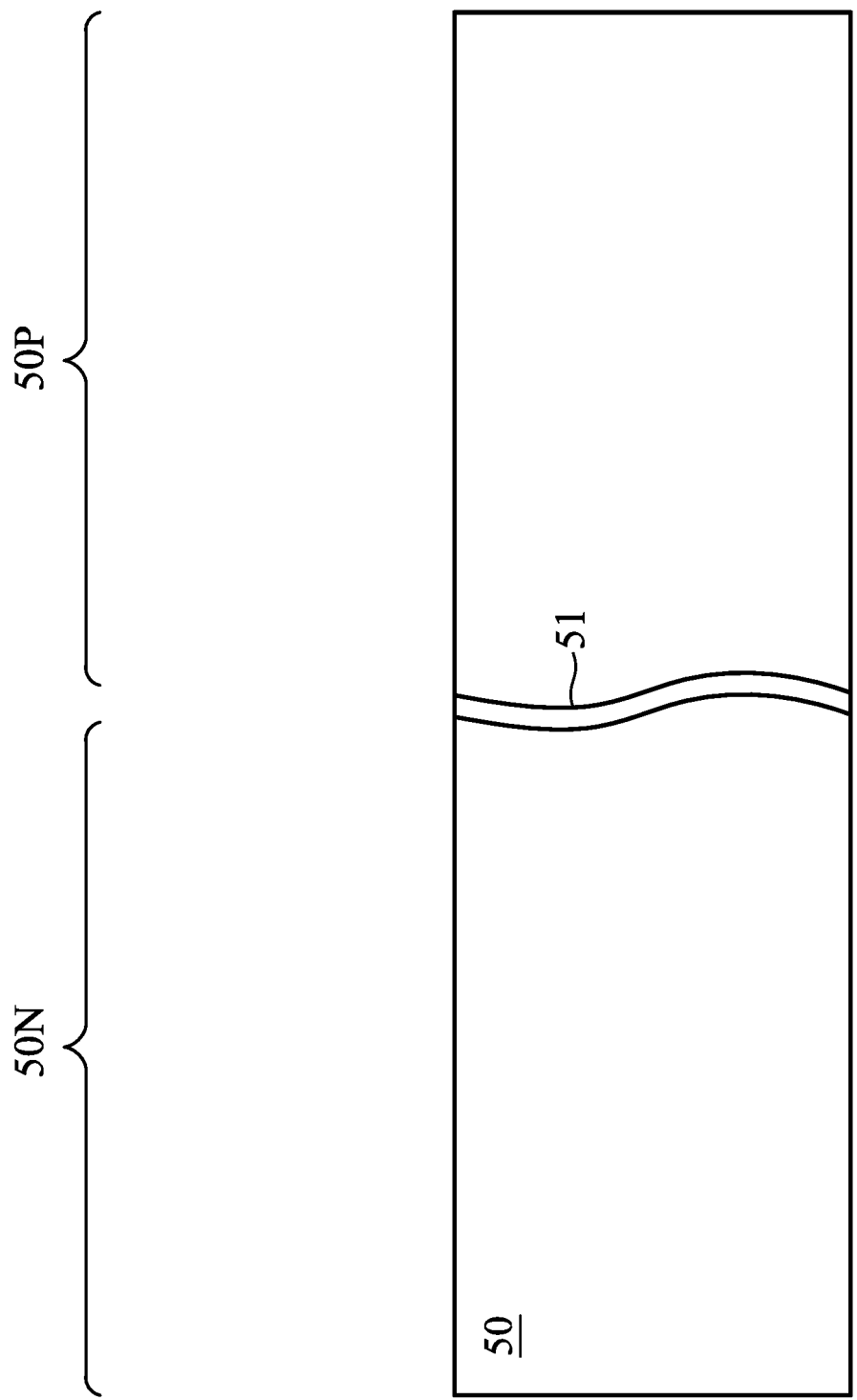

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AnInAs, AlGaAs, GaInAs, GaInP, and/or GaInAsP; or combinations thereof.

The substrate 50 has a region 50N and a region 50P. The region 50N may be for forming n-type devices, such as NMOS transistors, e.g., n-type FinFETs. The region 50P may be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
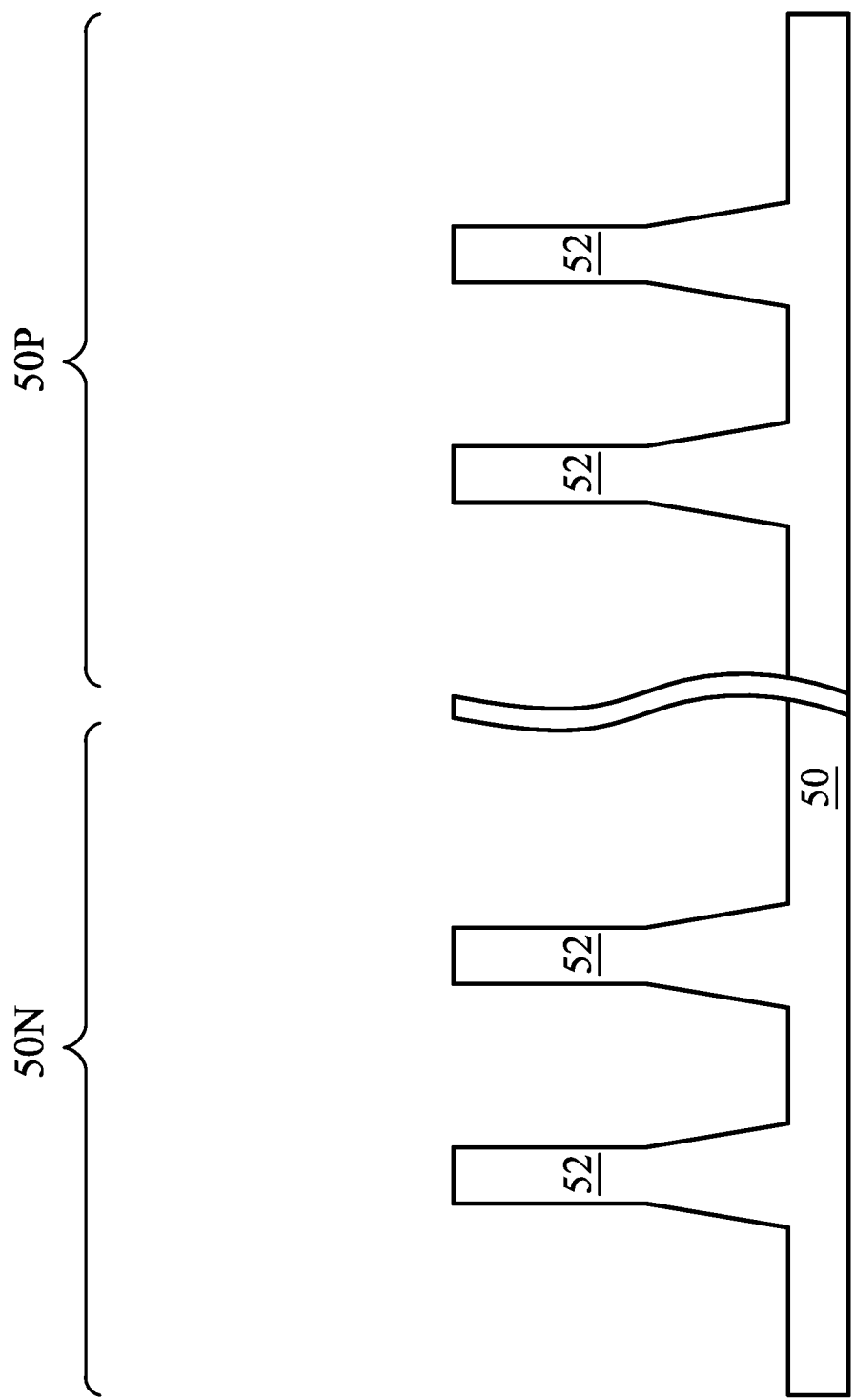

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etching may be anisotropic. Although the fins 52 are illustrated in FIG. 3 as having linear edges, the fins 52 may have rounded edges or any other suitable shape.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 50 and patterned using a photolithography process. Spacers are formed alongside the patterned sacrificial layer using a self-aligned process. The sacrificial layer is then removed, and the remaining spacers may then be used to pattern the fins 52.

Figure 4:
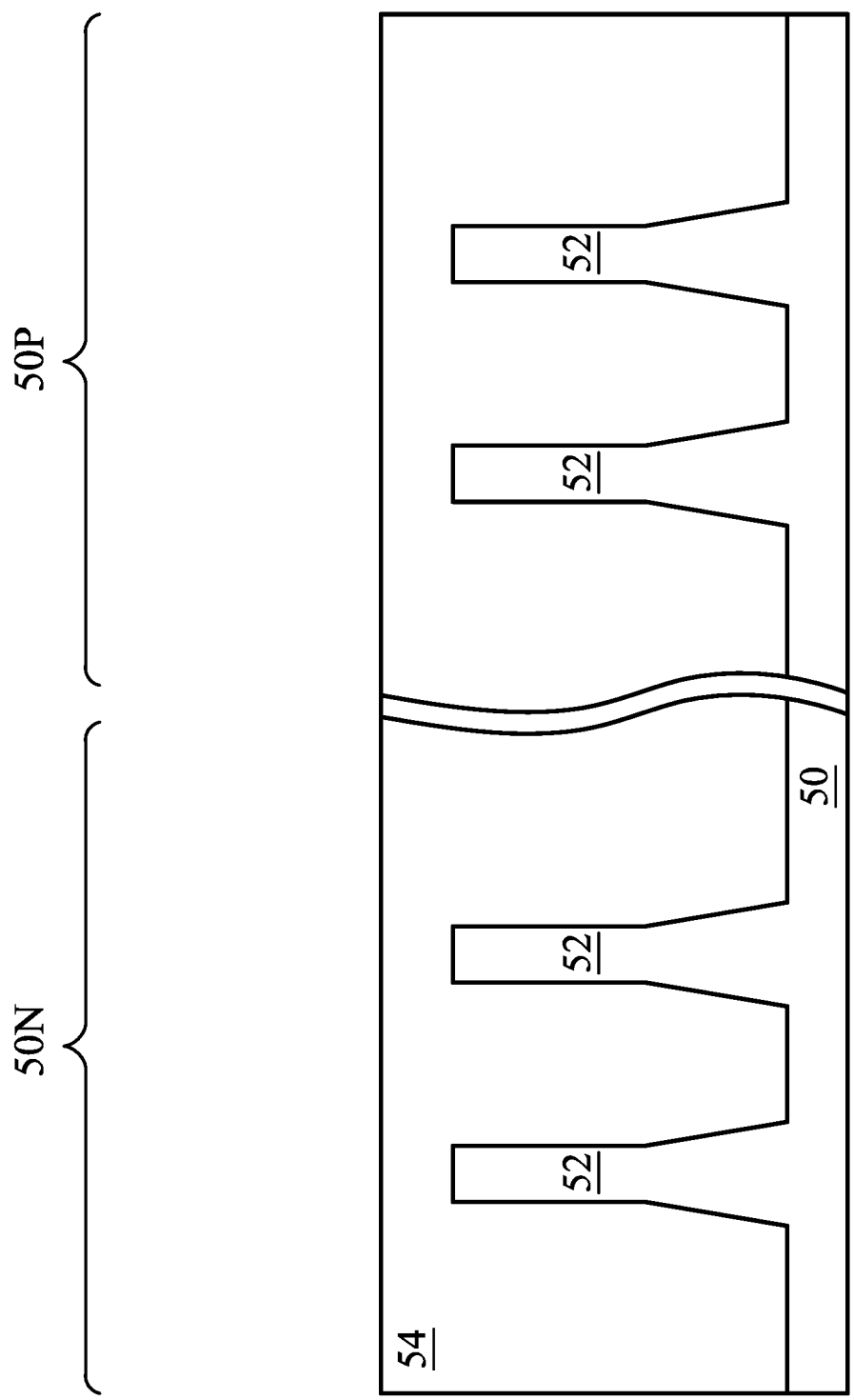

In FIG. 4, an insulation material 54 is formed over the substrate 50 and between neighboring fins 52. The insulation material 54 may be an oxide, such as silicon oxide, a nitride, the like, or a combination thereof, and may be formed by a high-density plasma chemical vapor deposition (HDP-CVD), a flowable CVD (FCVD) (e.g., a CVD-based material deposition in a remote plasma system and post curing to convert the deposited material to another material, such as an oxide), the like, or a combination thereof. Other insulation materials formed by any acceptable process may be used. In the illustrated embodiment, the insulation material 54 is silicon oxide formed by an FCVD process. An anneal process may be performed once the insulation material 54 is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not separately illustrated) may first be formed along a surface of the substrate 50 and the fins 52. Thereafter, a fill material, such as those discussed above may be formed over the liner.

Figure 5:
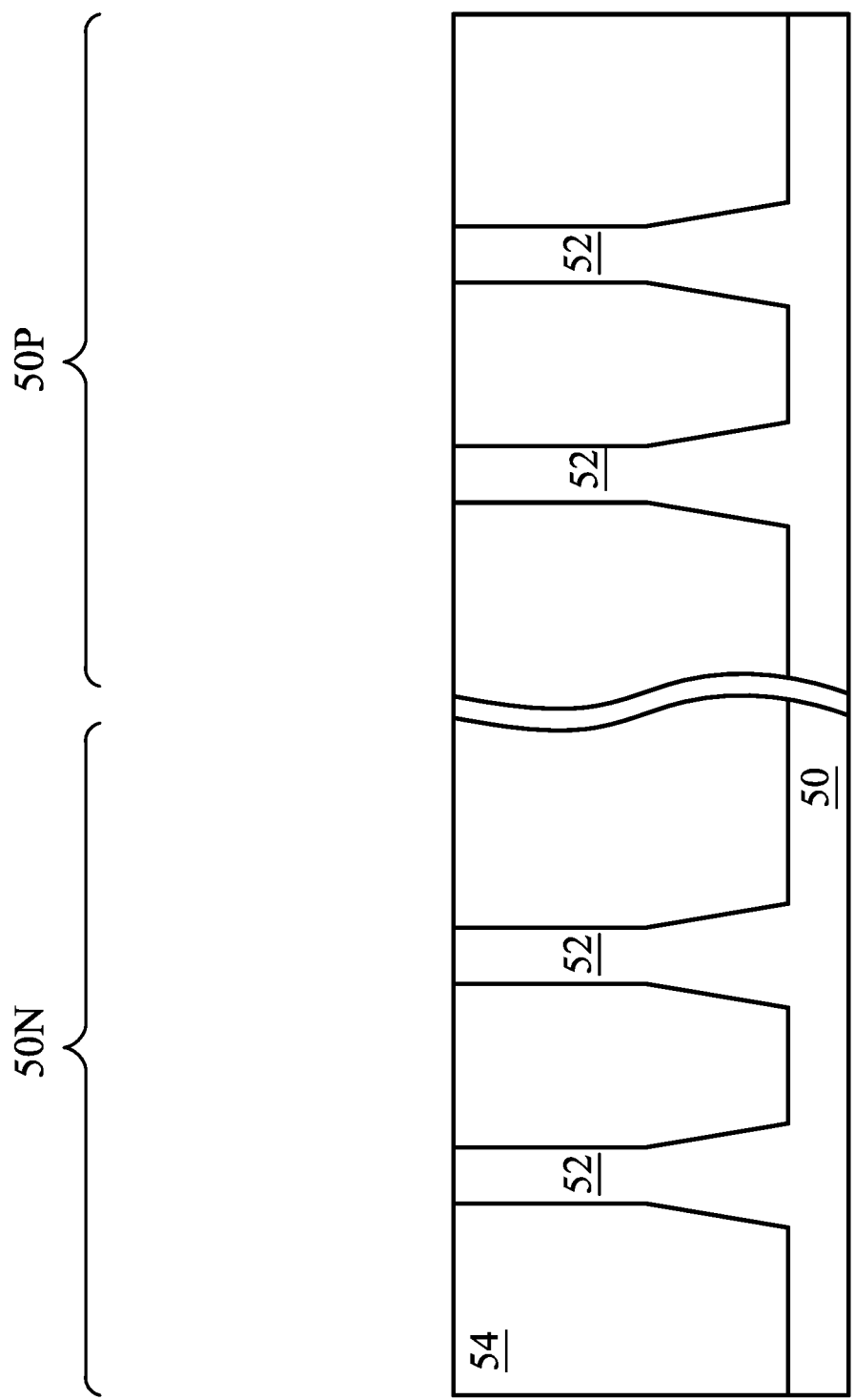

In FIG. 5, a removal process is applied to the insulation material 54 to remove excess insulation material 54 over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material 54 are level after the planarization process is complete.

Figure 6:
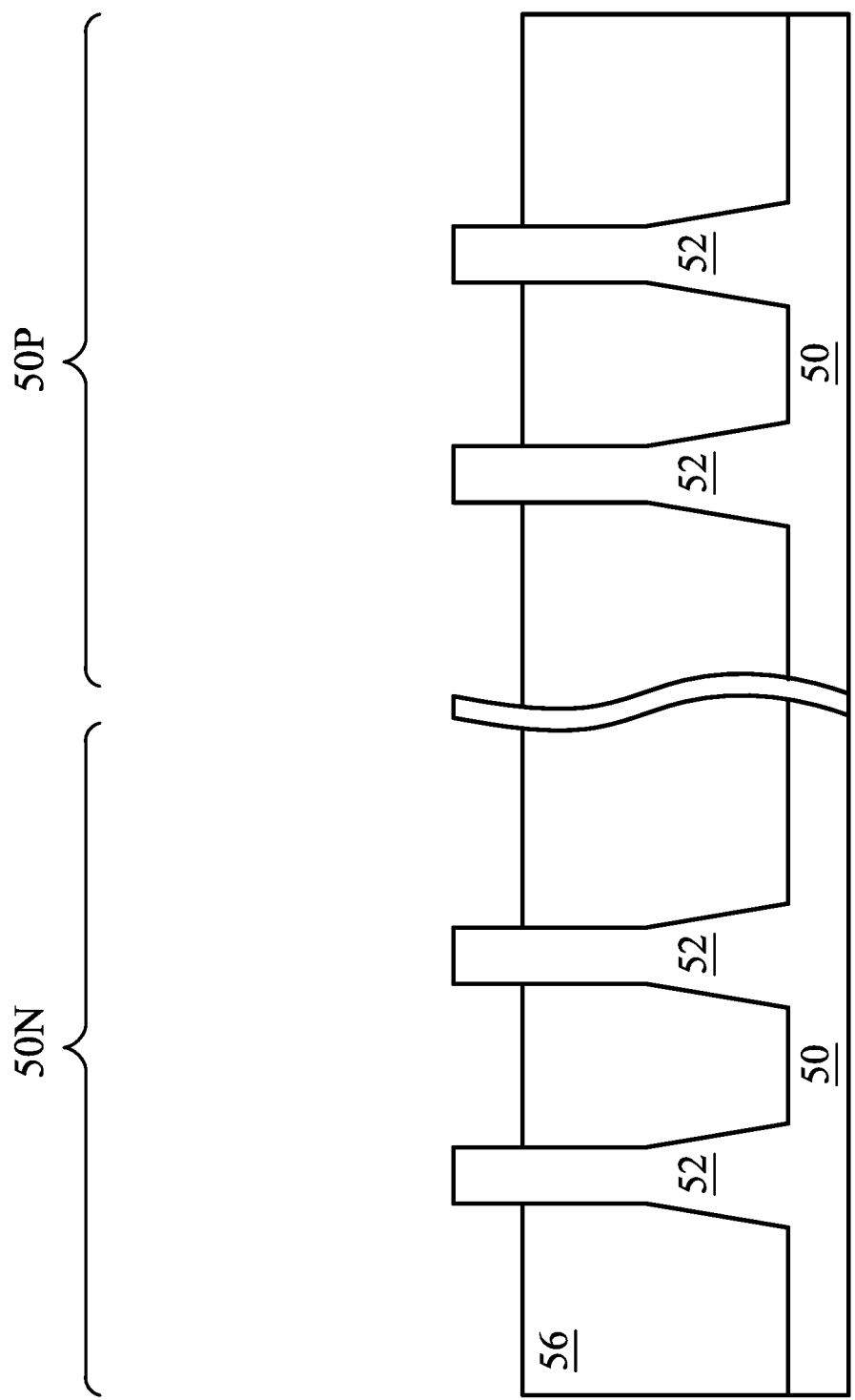

In FIG. 6, the insulation material 54 is recessed to form shallow trench isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by using an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins 52 may be formed by an epitaxial growth process. For example, a dielectric layer may be formed over a top surface of the substrate 50, and trenches can be etched through the dielectric layer to expose the underlying substrate 50. Homoepitaxial structures may be epitaxially grown in the trenches, and the dielectric layer may be recessed such that the homoepitaxial structures protrude from the dielectric layer to form fins 52. Additionally, in some embodiments, heteroepitaxial structures may be used for the fins 52. For example, the fins 52 in FIG. 5 may be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer may be formed over a top surface of the substrate 50, and trenches may be etched through the dielectric layer. Heteroepitaxial structures may then be epitaxially grown in the trenches using a material different from the substrate 50, and the dielectric layer may be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations, although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x may be in the range of 0 to 1), silicon carbide, pure or substantially pure germanium, a III-V compound semiconductor, a II-VI compound semiconductor, or the like. For example, the available materials for forming a III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not separately illustrated) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist may be formed by using a spin-on technique and may be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration equal to or less than $10^{18}$ atoms/cm$^3$, such as from about $10^{17}$ atoms/cm$^3$ to about $10^{18}$ atoms/cm$^3$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist may be formed by using a spin-on technique and may be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration equal to or less than $10^{18}$ atoms/cm$^3$, such as from about $10^{17}$ atoms/cm$^3$ to about $10^{18}$ atoms/cm$^3$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
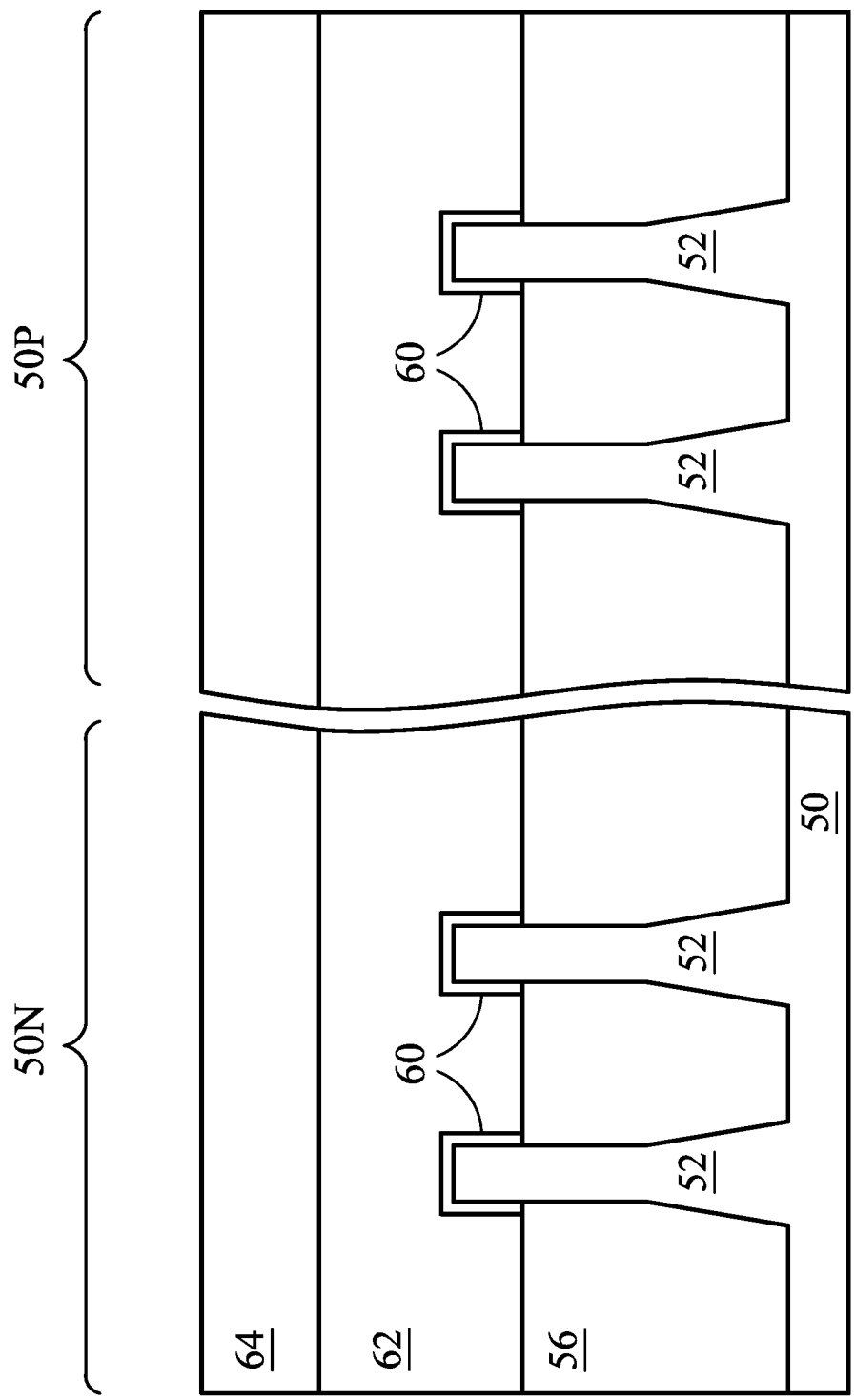

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized by a process such as CMP. The mask layer 64 may be deposited over the dummy gate layer 62. The dummy gate layer 62 may be a conductive material and may be selected from a group including amorphous silicon, polycrystalline-silicon (polysilicon), poly-crystalline silicon-germanium (poly-SiGe), metallic nitrides, metallic silicides, metallic oxides, metals, and the like. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions (e.g., the STI regions 56). The mask layer 64 may include, for example, SiN, SiON, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 21C illustrate various additional steps in the manufacturing of embodiment devices. FIGS. 8A through 21C illustrate features in either of the region 50N and the region 50P. For example, the structures illustrated in FIGS. 8A through 16B may be applicable to both the region 50N and the region 50P. Differences (if any) in the structures of the region 50N and the region 50P are described in the text accompanying each figure.

Figure 8B:
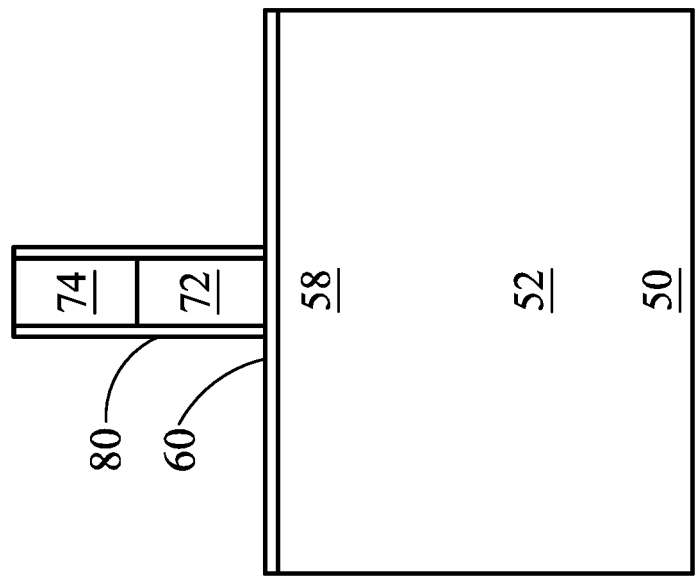
Figure 8A:
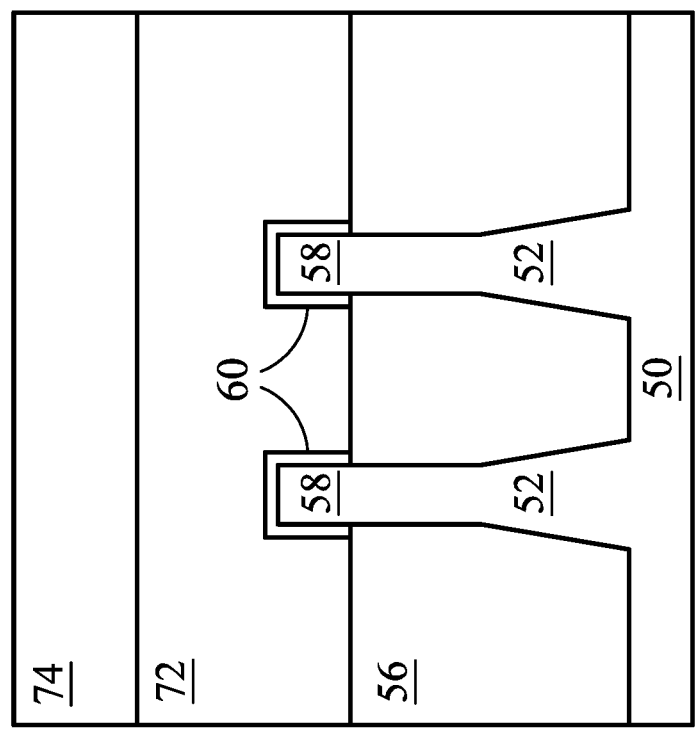

In FIGS. 8A and 8B, the mask layer 64 (see FIG. 7) may be patterned using acceptable photolithography and etching techniques to form masks 74. The pattern of the masks 74 then may be transferred to the dummy gate layer 62 by an acceptable etching technique to form dummy gates 72. In some embodiments (not separately illustrated), the pattern of the masks 74 may also be transferred to the dummy dielectric layer 60 by an acceptable etching technique. The dummy gates 72 cover respective channel regions 58 of the fins 52. The pattern of the masks 74 may be used to physically separate each of the dummy gates 72 from adjacent dummy gates 72. The dummy gates 72 may have a lengthwise direction substantially perpendicular to the lengthwise direction of respective fins 52.

Further in FIGS. 8A and 8B, gate seal spacers 80 may be formed on exposed surfaces of the dummy gates 72, the masks 74, and/or the fins 52. A thermal oxidation or a deposition followed by an anisotropic etch may be used to form the gate seal spacers 80.

After the formation of the gate seal spacers 80, implants for lightly doped source/drain (LDD) regions (not separately illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities from about $10^{15}$ atoms/cm$^3$ to about $10^{16}$ atoms/cm$^3$. An anneal may be used to activate the implanted impurities.

Figure 9B:
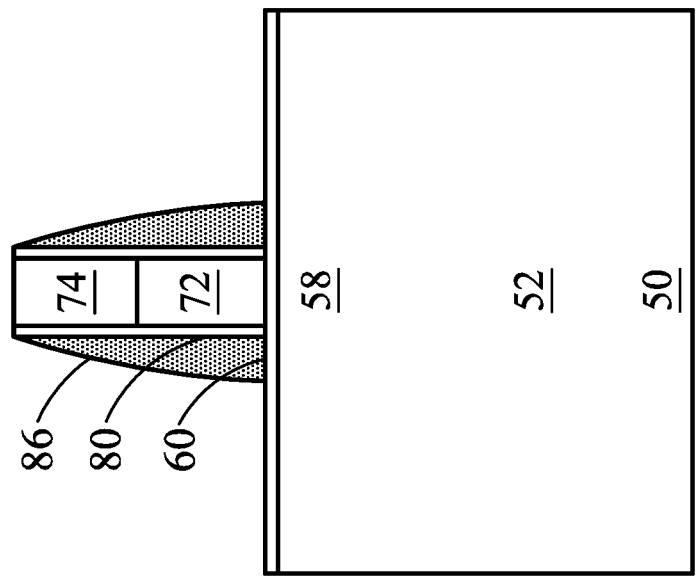
Figure 9A:
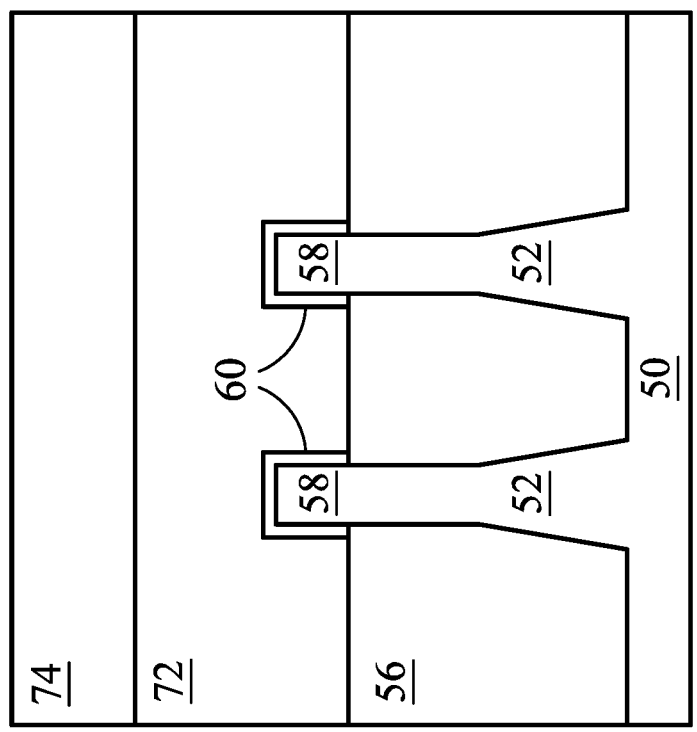

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon nitride, SiCN, a combination thereof, or the like.

Figure 10B:
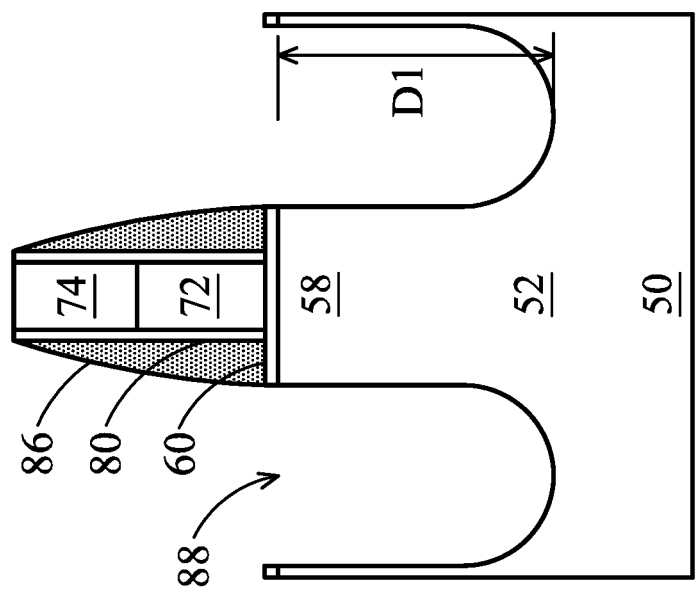
Figure 10A:
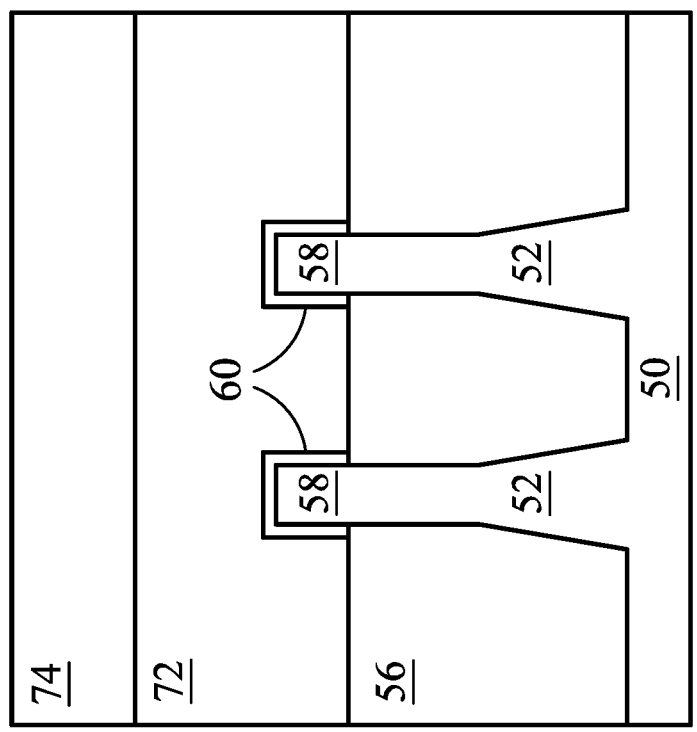
Figure 10C:
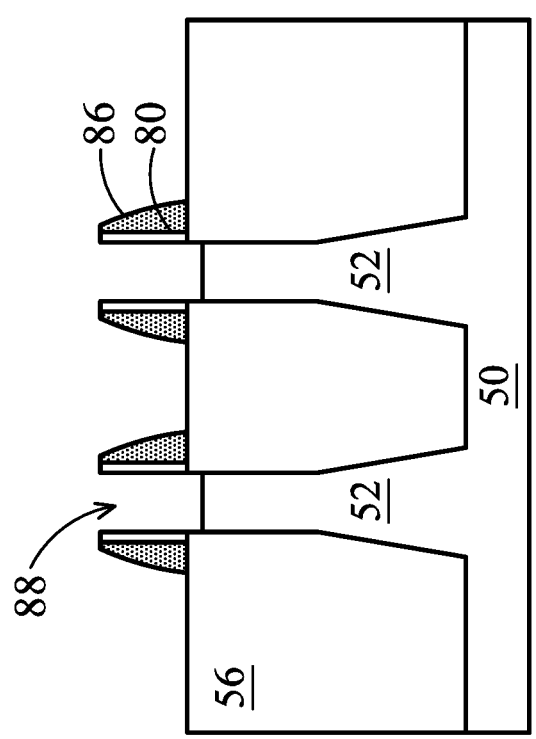

FIGS. 10A-14C illustrate various steps in forming source/drain regions 98A in the fins 52 in the region 50P. As illustrated in FIGS. 10A-14C, the source/drain regions 98A in the region 50P may be formed using a multi-step epitaxial deposition process. The source/drain regions 98A in the region 50P, e.g., the PMOS region, may be formed by masking the region 50N, e.g., the NMOS region. Recesses 88 are then formed in the fins 52 by etching source/drain regions of the fins 52 in the region 50P, as illustrated in FIGS. 10A-10C. The recesses 88 may have a depth D1 from about 20 nm to about 80 nm, such as about 50 nm.

In FIGS. 11A and 11B, a first source/drain layer 90 is epitaxially grown in the recesses 88. The first source/drain layer 90 may be formed of a material having high dopant out-diffusion. The high dopant out-diffusion of the first source/drain layer 90 may decrease the overlap resistance ($R_{ov}$) caused by the junction between the first source/drain layer 90 and the channel region 58 by allowing dopant ions to diffuse from the first source/drain layer 90 to the channel region 58 during operation. In some specific embodiments the first source/drain layer 90 may be formed of doped silicon, such as boron-doped silicon.

The first source/drain layer 90 may have a dopant concentration greater than about $1\times10^{20}$ atoms/cm$^3$, less than about $5\times10^{20}$ atoms/cm$^3$, or the like. In further embodiments, the first source/drain layer 90 may be doped with other p-type impurities, such as BF$_2$, indium, or the like. The first source/drain layer 90 may be implanted with dopants using in situ doping during growth, or using a process similar to the process previously discussed for forming lightly-doped source/drain regions, followed by an anneal. The first source/drain layer 90 may be act as a buffer layer between the substrate 50 and a subsequently formed second source/drain layer 92 and a subsequently formed third source/drain layer 94.

The first source/drain layer 90 is grown at a temperature from about 600° C. to about 800° C., such as about 700° C. and a pressure from about 5 Torr to about 50 Torr, such as about 25 Torr. The first source/drain layer 90 is grown for a period from about 10 seconds to about 200 seconds, such as about 100 seconds. The first source/drain layer 90 may be epitaxially grown from a precursor gas such as silane, disilane, dichlorosilane, diborane, combinations thereof, or the like. Sidewalls of the first source/drain layer 90 may have a thickness T1 less than about 5 nm and the bottom of the first source/drain layer 90 may have a thickness T2 less than about 5 nm. In some embodiments, the thickness T1 may be from about 1 nm to about 10 nm, such as about 5 nm and the thickness T2 may be from about 1 nm to about 10 nm, such as about 5 nm. Surfaces of the first source/drain layer 90 may be faceted. The thicknesses T1 and T2 of the first source/drain layer 90 may be minimized in order to maximize the thicknesses of the subsequently formed second source/drain layer 92 and the subsequently formed third source/drain layer 94.

Figure 12B:
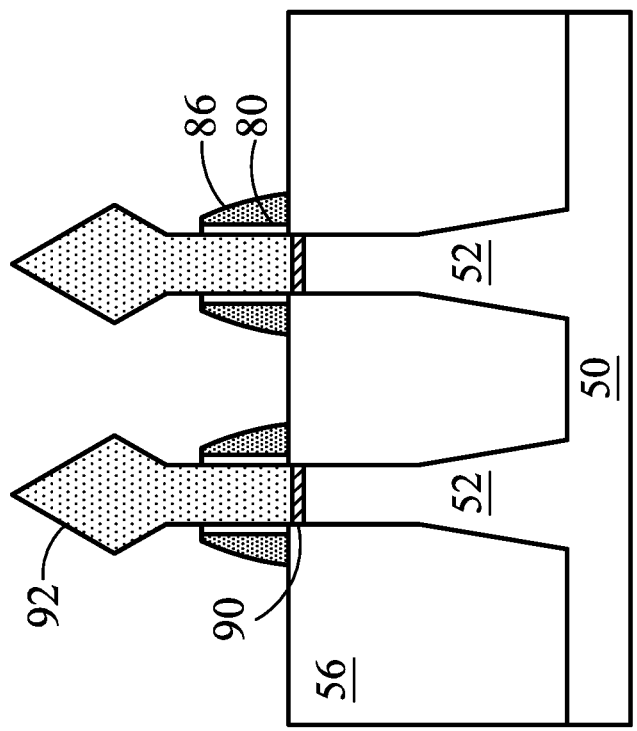
Figure 12A:
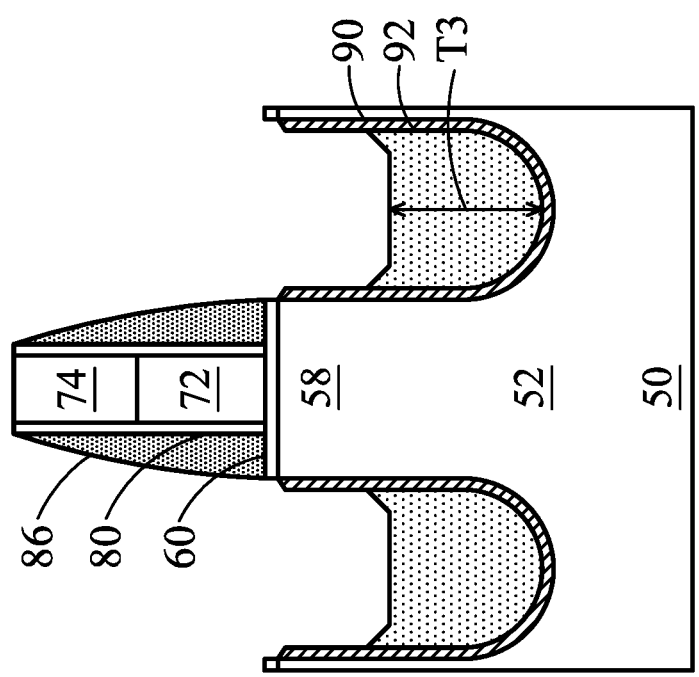

In FIGS. 12A and 12B, a second source/drain layer 92 is epitaxially grown in the recesses 88 over the first source/drain layer 90. The second source/drain layer 92 may be formed of a material having a lattice structure between that of the first source/drain layer 90 and a subsequently formed third source/drain layer 94. As such, the second source/drain layer 92 may be a buffer layer between the first source/drain layer 90 and the third source/drain layer 94. The second source/drain layer 92 may comprise materials exerting a compressive strain in the channel region 58, such as SiGe, SiGeB, Ge, GeSn, or the like. In some embodiments, the second source/drain layer 92 may comprise silicon germanium having an atomic percentage of germanium from about 20 percent to about 60 percent. The second source/drain layer 92 may have a gradient atomic percentage of germanium ranging from the concentration of germanium in the first source/drain layer 90 (e.g., about 0 atomic percent) to the concentration of germanium in the third source/drain layer 94 (e.g., from about 60 atomic percent to about 80 atomic percent).

The second source/drain layer 92 may be implanted with dopants using in situ doping during growth, or using a process similar to the process previously discussed for forming lightly-doped source/drain regions, followed by an anneal. The second source/drain layer may have a dopant concentration between the first source/drain layer 90 and the third source/drain layer 94. For example, the second source/drain layer 92 may have a dopant concentration greater than about $5\times10^{20}$ atoms/cm$^3$. The dopants may include p-type impurities such as boron, BF$_2$, indium, or the like.

The second source/drain layer 92 is grown at a temperature from about 600° C. to about 800° C., such as about 700° C. and a pressure from about 5 Torr to about 50 Torr, such as about 25 Torr. The second source/drain layer 92 is grown for a period from about 200 seconds to about 600 seconds, such as about 400 seconds. The second source/drain layer 92 may be epitaxially grown from a precursor gas such as silane, disilane, dichlorosilane, germane, germanium tetrachloride, diborane, combinations thereof, or the like. The second source/drain layer 92 has a thickness less than about 30 nm, less than about less than about 25 nm, or the like. As illustrated in FIGS. 12A and 12B, the second source/drain layer 92 may have facets. An angle θ1 of the facets may be from about 0° to about 60°. The second source/drain layer 92 may be a buffer layer between the first source/drain layer 90 and a subsequently formed third source/drain layer 94. The thickness of the second source/drain layer 92 may be minimized to maximize the thickness of the third source/drain layer 94. Although the second source/drain layer 92 is illustrated in FIGS. 12A and 12B as being unmerged, in some embodiments, the facets may cause adjacent second source/drain layers 92 to merge.

Figure 13B:
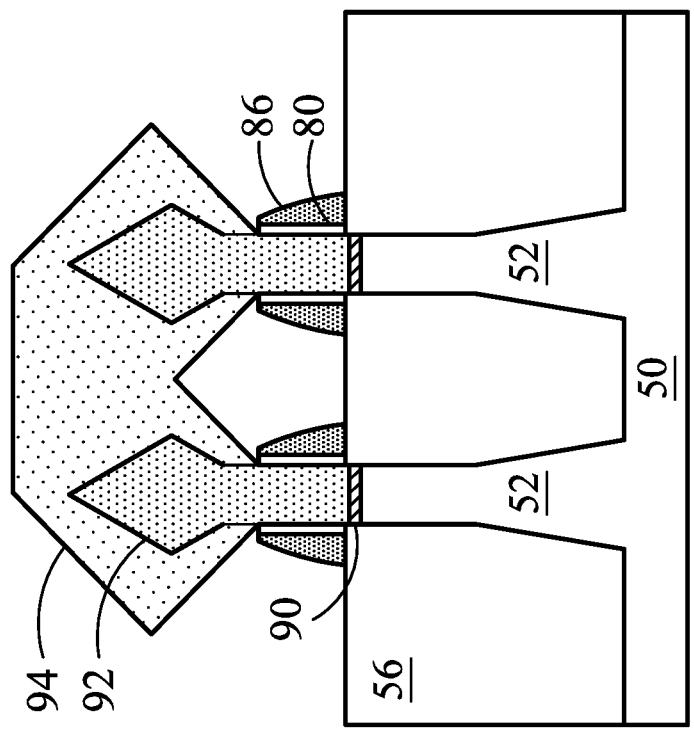
Figure 13A:
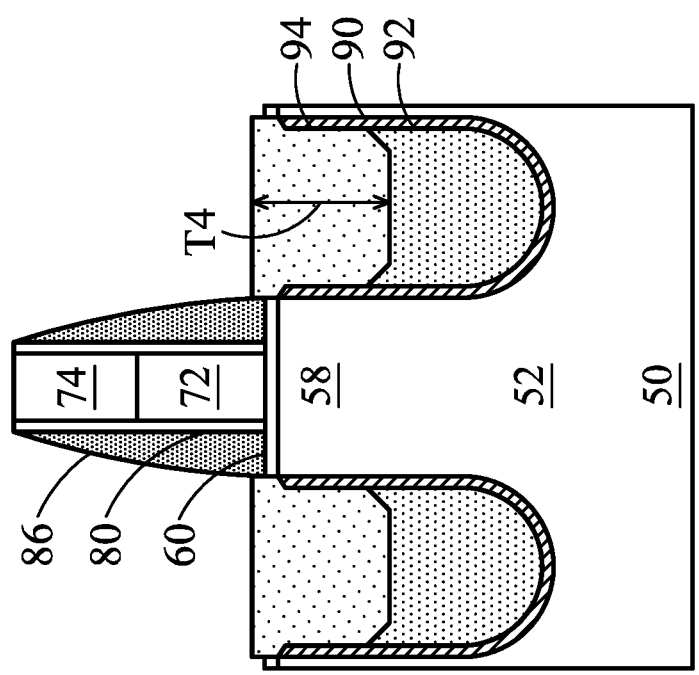

In FIGS. 13A and 13B, a third source/drain layer 94 is epitaxially grown in the recesses 88 over the second source/drain layer 92. The third source/drain layer 94 may be formed of a material having low resistivity and exerting high compressive strain on the material of the channel region 58, which may decrease the source/drain resistance ($R_{sd}$), the contact resistance ($R_{csd}$), and the channel resistance ($R_{ch}$). For example, the third source/drain layer 94 may comprise SiGe, SiGeB, Ge, GeSn, or the like. In some embodiments, the third source/drain layer 94 may comprise silicon germanium having an atomic percentage of germanium from about 60 percent to about 80 percent.

The third source/drain layer 94 may be implanted with dopants using in situ doping during growth, or using a process similar to the process previously discussed for forming lightly-doped source/drain regions, followed by an anneal. The third source/drain layer 94 may have an impurity concentration greater than about $6\times10^{20}$ atoms/cm$^3$, greater than about $8\times10^{20}$ atoms/cm$^3$, or the like. The dopants may include p-type impurities such as boron, $BF_2$, indium, or the like.

The third source/drain layer 94 is grown at a temperature less than about 600° C., such as from about 300° C. to about 600° C. and a pressure greater than about 20 Torr. The third source/drain layer 94 is grown for a period from about 10 seconds to about 200 seconds, such as about 100 seconds. The third source/drain layer 94 may be epitaxially grown from a precursor gas such as silane, disilane, dichlorosilane, germane, germanium tetrachloride, diborane, combinations thereof, or the like. The third source/drain layer 94 has a thickness T4 greater than about 20 nm. A ratio of the thickness T4 to the average of the thickness T1 and the thickness T2 may be greater than about 5. A ratio of the thickness T4 to the thickness T3 may be greater than about 0.6. The third source/drain layer 94 may have surfaces raised from respective surfaces of the fins 52 and may have facets. Further, the epitaxial growth processes used to form the third source/drain layer 94 may cause adjacent third source/drain layers 94 to merge, as illustrated in FIG. 13B. As further illustrated in FIG. 13B, an uppermost surface of the third source/drain layer 94 extending between adjacent fins 52 may be substantially flat. In other embodiments, the uppermost surface of the third source/drain layer 94 may include a valley between the adjacent fins 52.

Figure 14B:
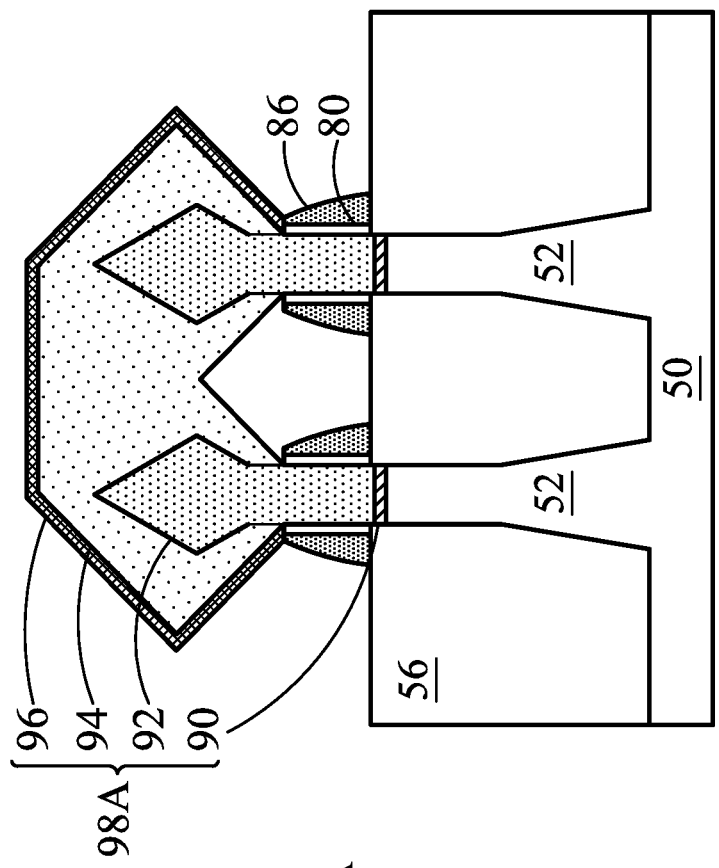
Figure 14A:
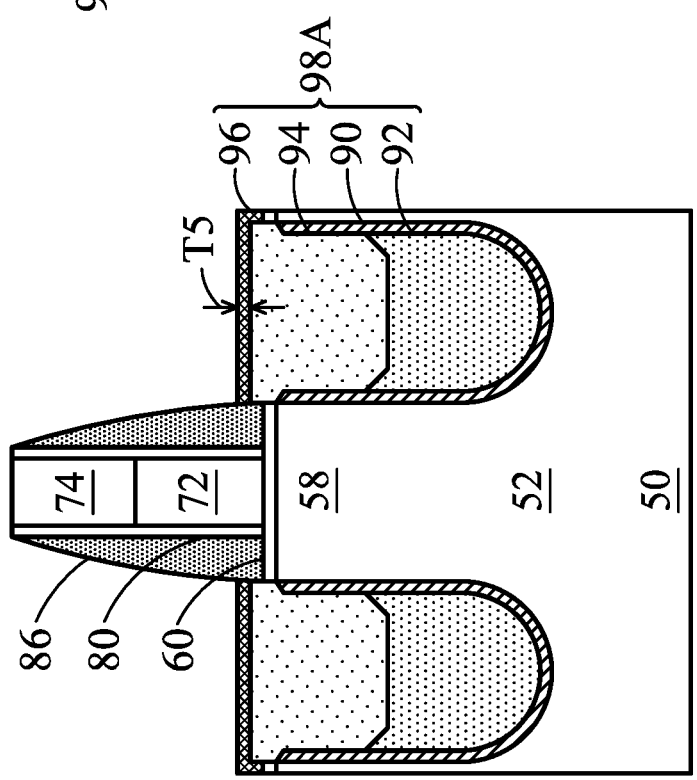
Figure 14C:
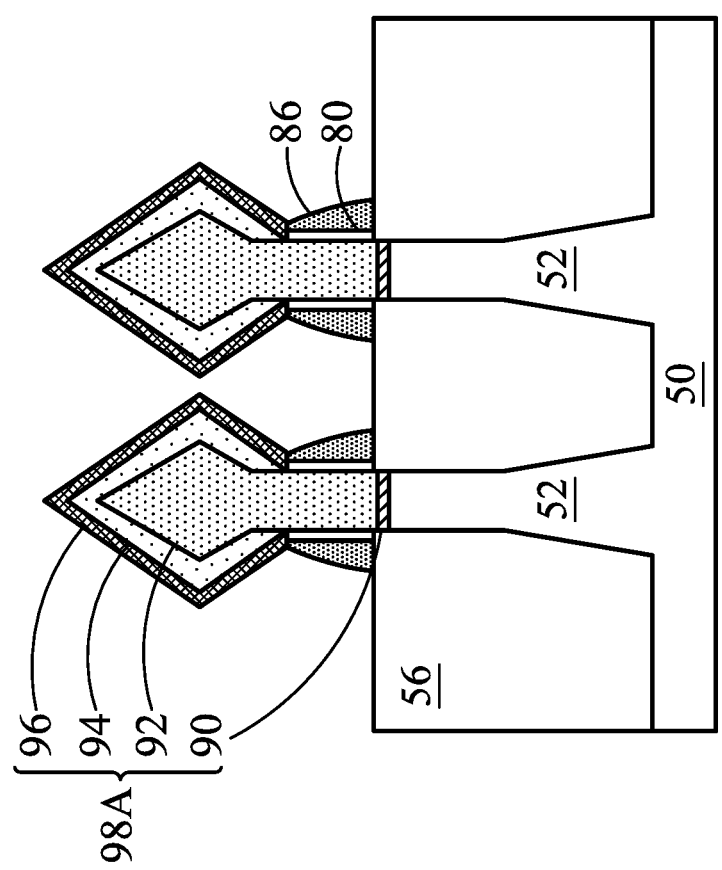
Figure 15C:
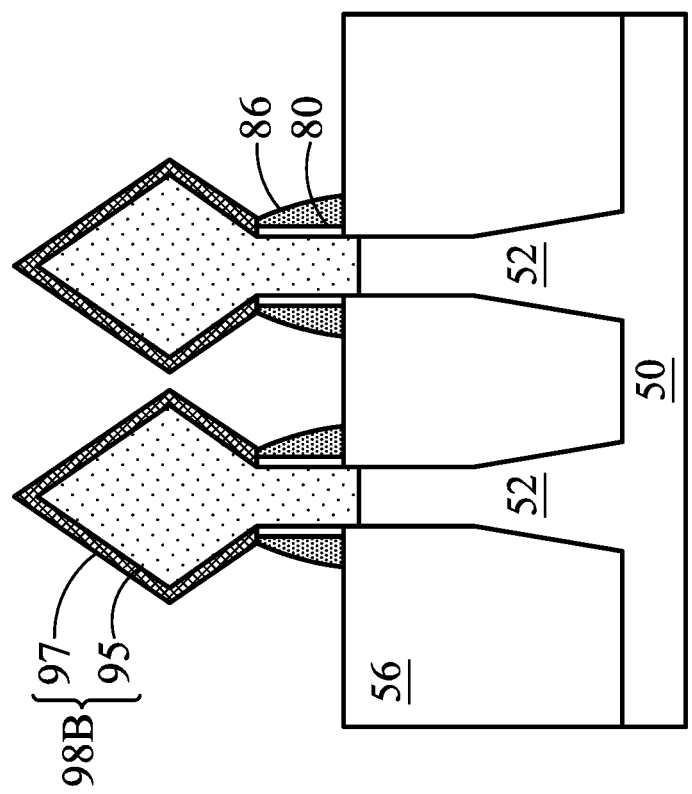

In FIGS. 14A-14C, a fourth source/drain layer 96 is epitaxially grown over the third source/drain layer 94 to form source/drain regions 98A comprising the first source/drain layer 90, the second source/drain layer 92, the third source/drain layer 94, and the fourth source/drain layer 96. Although the source/drain regions 98A are illustrated in FIG. 14B as being merged, in some embodiments, such as the embodiment illustrated in FIG. 14C, the source/drain regions 98A may remain separated after the epitaxy process is completed. The fourth source/drain layer 96 may include any acceptable material, such as appropriate for p-type FinFETs. For example, the fourth source/drain layer 96 may comprise materials exerting a compressive strain in the channel region 58, such as SiGe, SiGeB, Ge, GeSn, or the like. In some embodiments, the fourth source/drain layer 96 may comprise silicon germanium having an atomic percentage of germanium from about 10 percent to about 30 percent, less than about 20 percent, or the like.

The fourth source/drain layer 96 may be implanted with dopants using in situ doping during growth, or using a process similar to the process previously discussed for forming lightly-doped source/drain regions, followed by an anneal. The fourth source/drain layer 96 may have an impurity concentration less than about $1\times10^{20}$ atoms/cm$^3$. The dopants may include p-type impurities such as boron, $BF_2$, indium, or the like.

The fourth source/drain layer 96 is grown at a temperature from about 600° C. to about 800° C., such as about 700° C. and a pressure from about 10 Torr to about 80 Torr, such as about 50 Torr. The fourth source/drain layer 96 is grown for a period from about 30 seconds to about 200 seconds, such as about 100 seconds. The fourth source/drain layer 96 may be epitaxially grown from a precursor gas such as silane, disilane, dichlorosilane, germane, germanium tetrachloride, diborane, combinations thereof, or the like. The fourth source/drain layer 96 has a thickness T5 less than about 10 nm. A ratio of the thickness T4 to the thickness T5 may be greater than about 2. The fourth source/drain layer 96 may have surfaces raised from respective surfaces of the fins 52 and may have facets.

The fourth source/drain layer 96 may be a sacrificial layer or an etch stop layer. For example, as will be discussed in greater detail below with respect to FIG. 21B, the fourth source/drain layer 96 may protect the third source/drain layer 94 during an etch process used to form openings in which source/drain contacts 116 are formed. As such, the fourth source/drain layer 96 may be formed of a material having high etch selectivity to the material of the first ILD 100.

The third source/drain layer 94 has a higher germanium concentration than the first source/drain layer 90, the second source/drain layer 92, and the fourth source/drain layer 96. Thus, increasing the volume of the third source/drain layer 94 relative to the first source/drain layer 90, the second source/drain layer 92, and the fourth source/drain layer 96 increases the overall germanium concentration in the source/drain regions 98A. This reduces the overall resistivity of the source/drain regions 98A, which decreases the source/drain resistance ($R_{sd}$) and the contact resistance ($R_{csd}$) of the source/drain regions 98A. Moreover, the source/drain regions 98A provide greater compressive strain to the channel region 58, which reduces the channel resistance ($R_{ch}$). Further, increasing the volume of the third source/drain layer 94 provides a larger landing for subsequently formed source/drain contacts 116, which reduces device defects and improves device yield.

In FIGS. 15A-15C, source/drain regions 98B are formed in the fins 52 in the region 50N. The source/drain regions 98B may be formed by conventional methods. The source/drain regions 98B in the region 50N, e.g., the NMOS region, may be formed by masking the region 50P, e.g., the PMOS region, and etching source/drain regions of the fins 52 in the region 50N to form recesses (not separately illustrated) in the fins 52. Then, a fifth source/drain layer 95 in the region 50N is epitaxially grown in the recesses. A sixth source/drain layer 97 is epitaxially grown over the fifth source/drain layer 95 to act as a sacrificial layer or an etch stop layer, similar to the fourth source/drain layer 96, discussed above. The source/drain regions 98B comprise the fifth source/drain layer 95 in combination with the sixth source/drain layer 97. The source/drain regions 98B may include any acceptable material, such as appropriate for n-type FinFETs. For example, if the fin 52 is silicon, the source/drain regions 98B in the region 50N may include materials exerting a tensile strain in the channel region 58, such as silicon, SiC, SiCP, SiP, or the like. The source/drain regions 98B in the region 50N may have surfaces raised from respective surfaces of the fins 52 and may have facets. As further illustrated in FIG. 15B, an uppermost surface of the fifth source/drain layer 95 extending between adjacent fins 52 may be substantially flat. In other embodiments, the uppermost surface of the fifth source/drain layer 95 may include a valley between the adjacent fins 52.

The source/drain regions 98B and/or the fins 52 may be implanted with dopants to form source/drain regions, similar to the process previously discussed for forming lightly-doped source/drain regions, followed by an anneal. The source/drain regions may have an impurity concentration from about $10^{19}$ cm$^{-3}$ to about $10^{21}$ cm$^{-3}$. The n-type impurities for the source/drain regions 98B may be any of the impurities previously discussed. In some embodiments, the source/drain regions 98B may be in situ doped during growth.

As a result of the epitaxy processes used to form the source/drain regions 98B in the region 50N, upper surfaces of the source/drain regions 98B have facets which expand laterally outward beyond sidewalls of the fins 52. In some embodiments, these facets cause adjacent source/drain regions 98B of a same FinFET to merge as illustrated by FIG. 15B. In other embodiments, such as the embodiment illustrated in FIG. 15C, the source/drain regions 98B may remain separated after the epitaxy process is completed.

Figure 16B:
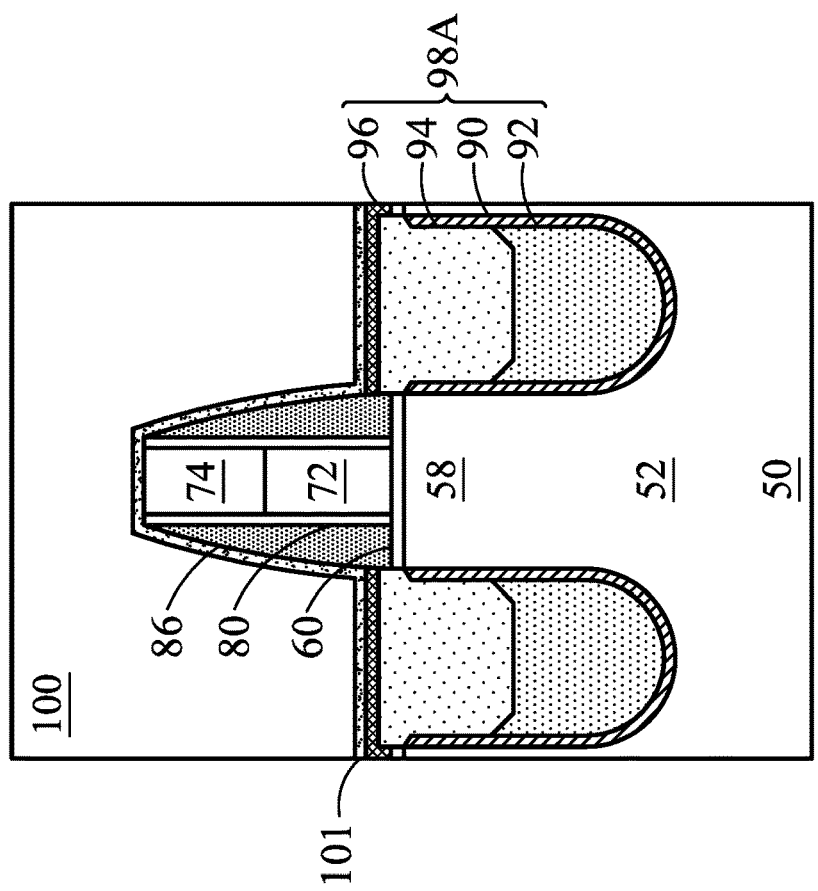
Figure 16A:
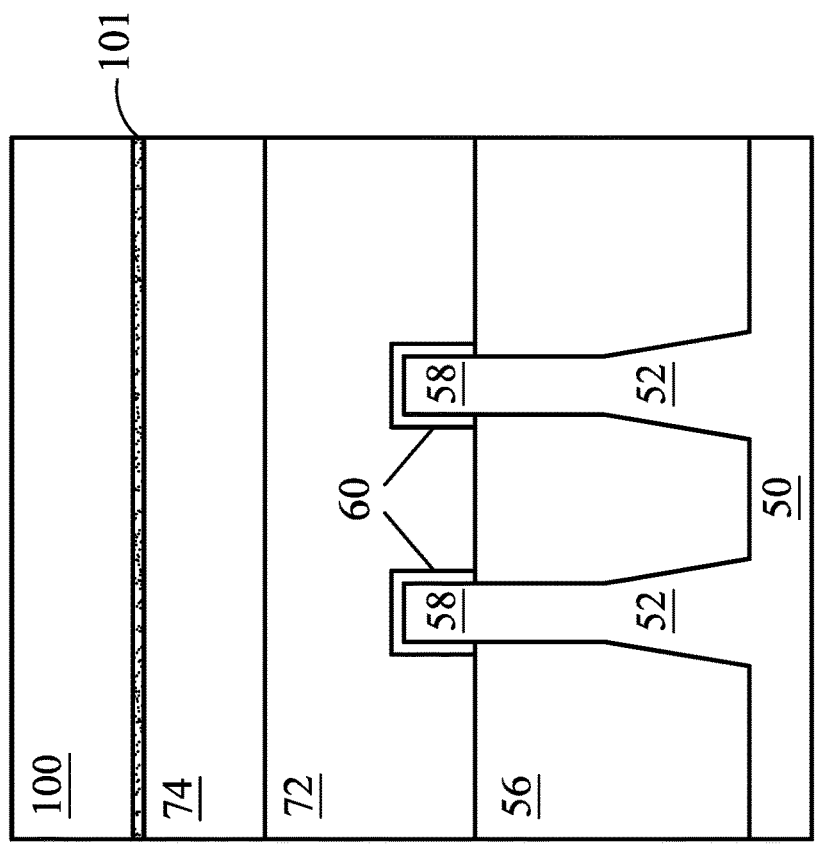

In FIGS. 16A and 16B, a first ILD 100 is deposited over the structure illustrated in FIGS. 14A, 14B, 15A, and 15B. The first ILD 100 may be formed of a dielectric material, and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. Other insulation materials formed by any acceptable process may be used. In some embodiments, a contact etch stop layer (CESL) 101 is disposed between the first ILD 100 and the source/drain regions 98A and 98B, the masks 74, and the gate spacers 86. The CESL 101 may comprise a dielectric material, such as, silicon nitride, silicon oxide, silicon oxynitride, or the like, having a different etch rate than the material of the overlying first ILD 100.

Figure 17B:
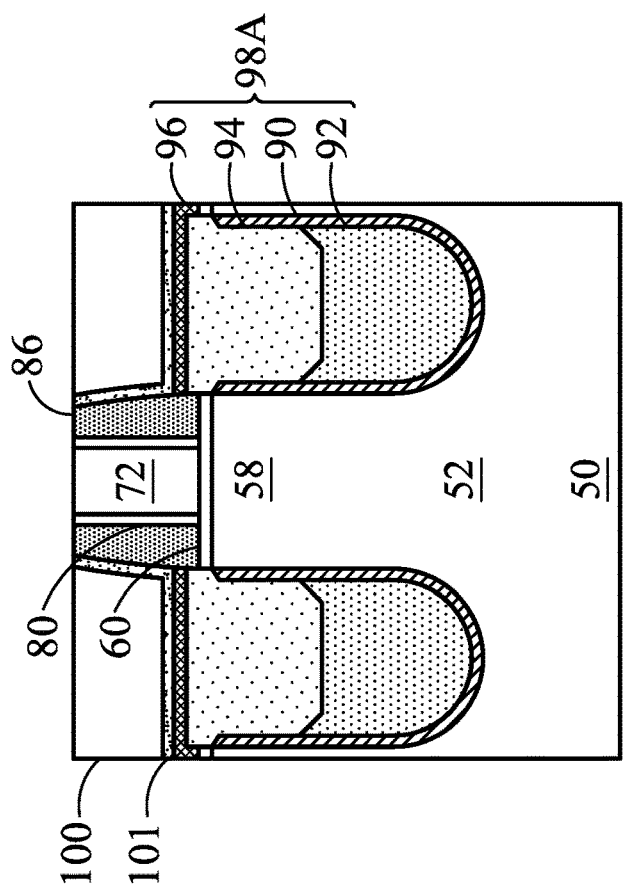
Figure 17A:
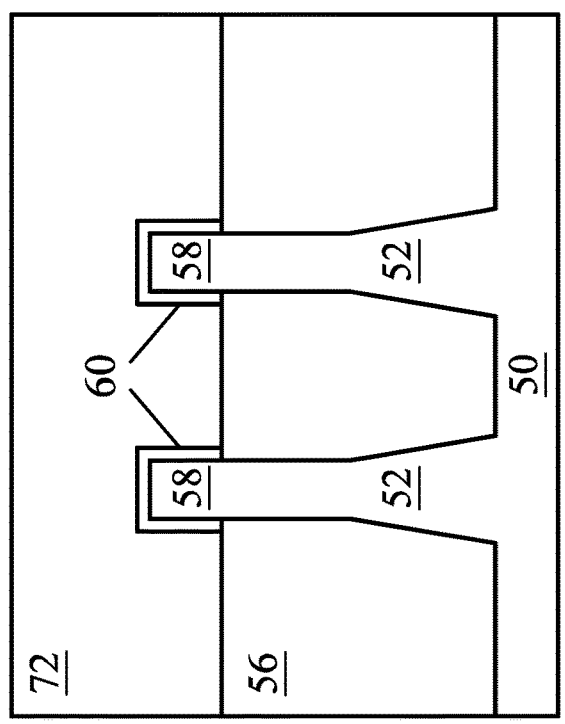

In FIGS. 17A and 17B, a planarization process, such as a CMP, may be performed to level the top surface of the first ILD 100 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 100 are level. Accordingly, the top surfaces of the dummy gates 72 are exposed through the first ILD 100. In some embodiments, the masks 74 may remain, in which case the planarization process levels the top surface of the first ILD 100 with the top surfaces of the top surface of the masks 74.

Figure 18B:
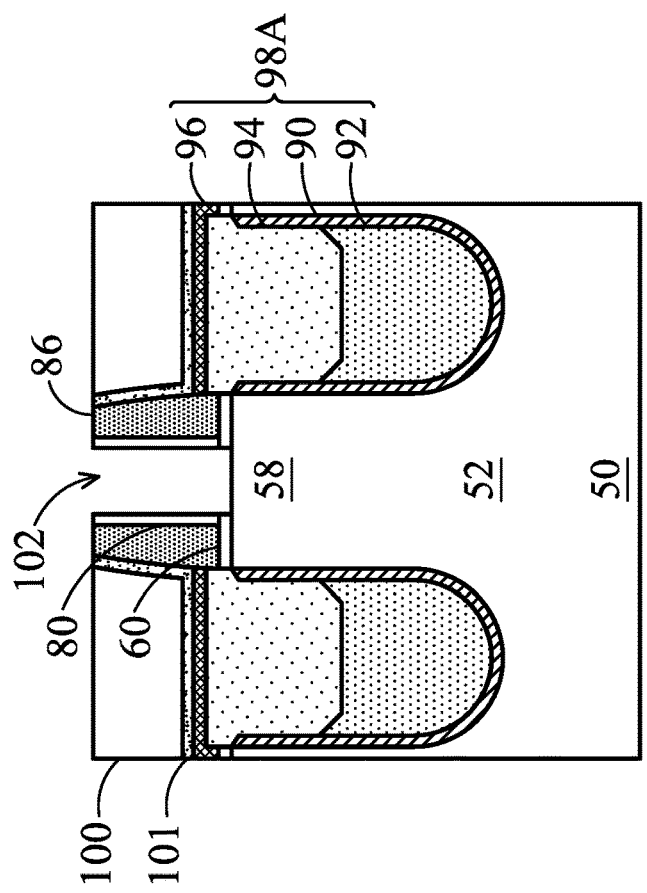
Figure 18A:
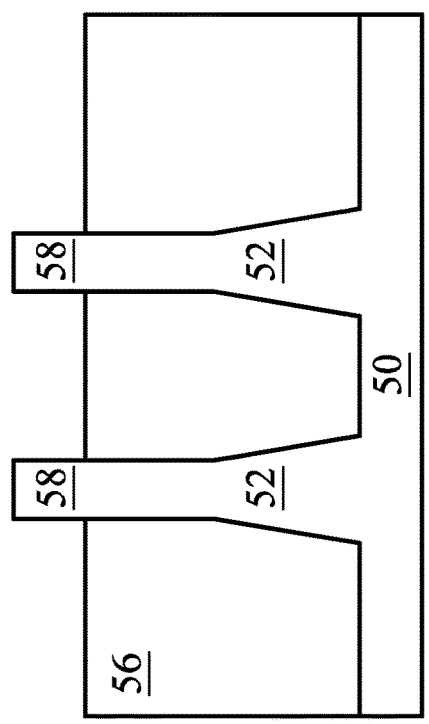

In FIGS. 18A and 18B, the dummy gates 72, and the masks 74 if present, are removed in an etching step(s), so that recesses 102 are formed. Portions of the dummy dielectric layer 60 in the recesses 102 may also be removed. In some embodiments, only the dummy gates 72 are removed and the dummy dielectric layer 60 remains and is exposed by the recesses 102. In some embodiments, the dummy dielectric layer 60 is removed from recesses 102 in a first region of a die (e.g., a core logic region) and remains in recesses 102 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 100 or the gate spacers 86. Each recess 102 exposes a channel region 58 of a respective fin 52. Each channel region 58 is disposed between neighboring pairs of the source/drain regions 98A and the source/drain regions 98B. During the removal, the dummy dielectric layer 60 may be used as an etch stop layer when the dummy gates 72 are etched. The dummy dielectric layer 60 may then be optionally removed after the removal of the dummy gates 72.

Figures 19A, 19B:
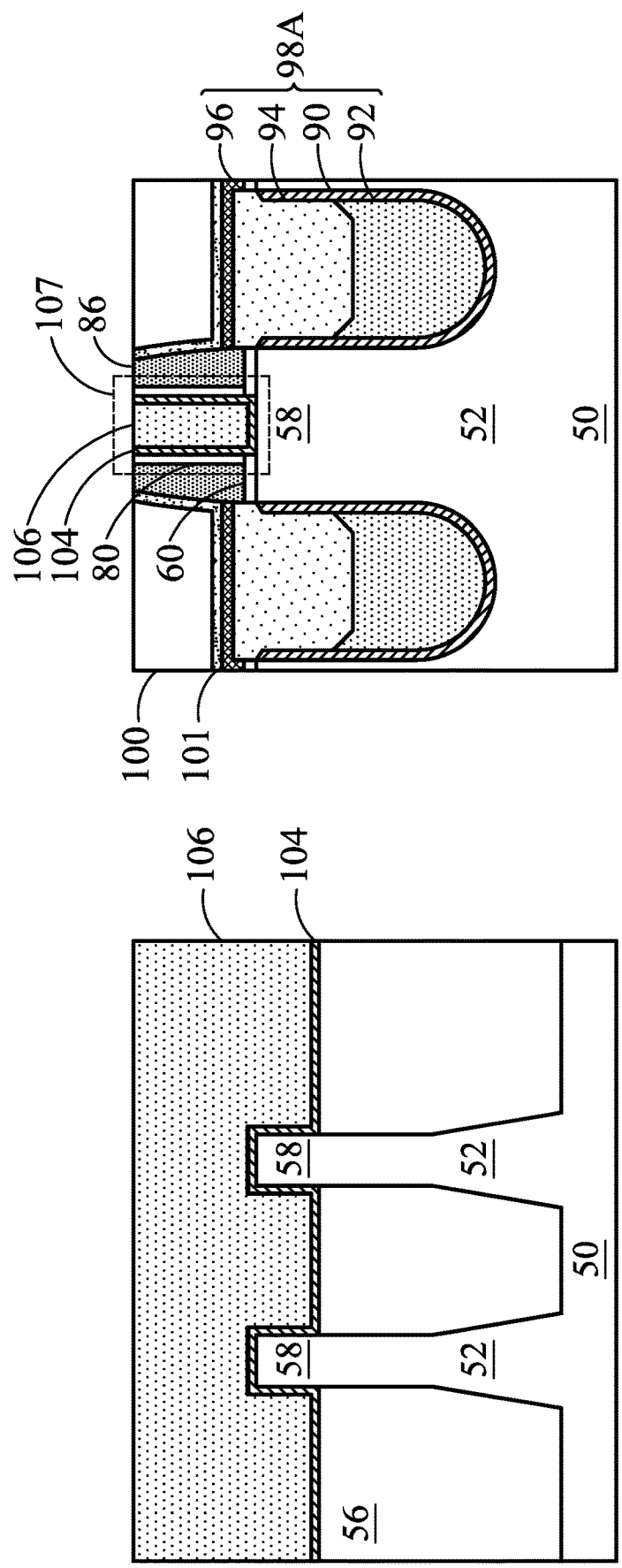
Figure 19C:
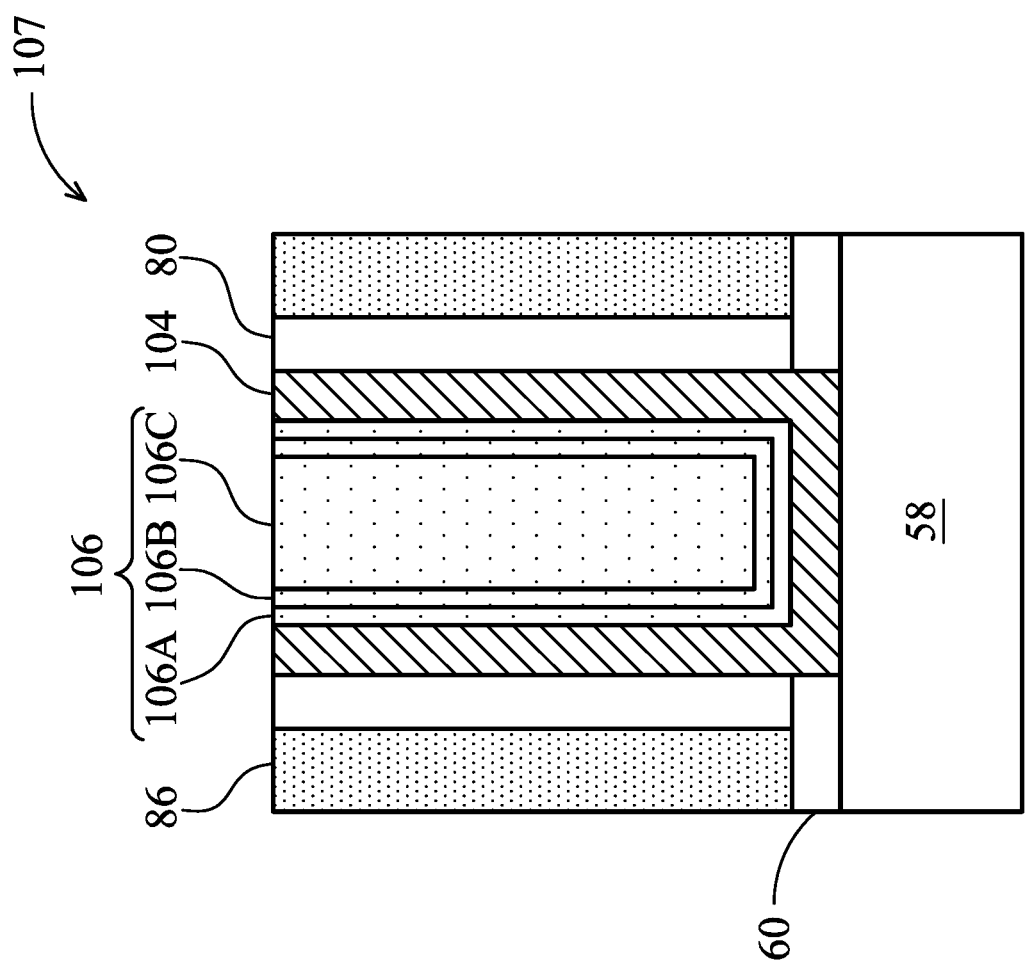

In FIGS. 19A and 19B, gate dielectric layers 104 and gate electrodes 106 are formed for replacement gates. FIG. 19C illustrates a detailed view of region 107 of FIG. 19B. Gate dielectric layers 104 are deposited conformally in the recesses 102, such as on the top surfaces and the sidewalls of the fins 52 and on sidewalls of the gate seal spacers 80/gate spacers 86. The gate dielectric layers 104 may also be formed on top surface of the first ILD 100. In accordance with some embodiments, the gate dielectric layers 104 comprise silicon oxide, silicon nitride, or multilayers thereof. In some embodiments, the gate dielectric layers 104 include a high-k dielectric material, and in these embodiments, the gate dielectric layers 104 may have a k value greater than about 7.0, and may include a metal oxide or a silicate of Hf, Al, Zr, La, Mg, Ba, Ti, Pb, and combinations thereof. The formation methods of the gate dielectric layers 104 may include molecular-beam deposition (MBD), ALD, PECVD, and the like. In embodiments where portions of the dummy dielectric layer 60 remains in the recesses 102, the gate dielectric layers 104 include a material of the dummy dielectric layer 60 (e.g., SiO$_2$).

The gate electrodes 106 are deposited over the gate dielectric layers 104, respectively, and fill the remaining portions of the recesses 102. The gate electrodes 106 may include a metal-containing material such as TiN, TiO, TaN, TaC, Co, Ru, Al, W, combinations thereof, or multi-layers thereof. For example, although a single layer gate electrode 106 is illustrated in FIG. 19B, the gate electrode 106 may comprise any number of liner layers 106A, any number of work function tuning layers 106B, and a fill material 106C as illustrated by FIG. 19C. After the filling of the gate electrodes 106, a planarization process, such as a CMP, may be performed to remove the excess portions of the gate dielectric layers 104 and the material of the gate electrodes 106, which excess portions are over the top surface of the first ILD 100. The remaining portions of material of the gate electrodes 106 and the gate dielectric layers 104 thus form replacement gates of the resulting FinFETs. The gate electrodes 106 and the gate dielectric layers 104 may be collectively referred to as a "gate stack." The gate and the gate stacks may extend along sidewalls of a channel region 58 of the fins 52.

The formation of the gate dielectric layers 104 in the region 50N and the region 50P may occur simultaneously such that the gate dielectric layers 104 in each region are formed from the same materials, and the formation of the gate electrodes 106 may occur simultaneously such that the gate electrodes 106 in each region are formed from the same materials. In some embodiments, the gate dielectric layers 104 in each region may be formed by distinct processes, such that the gate dielectric layers 104 may be different materials, and/or the gate electrodes 106 in each region may be formed by distinct processes, such that the gate electrodes 106 may be different materials. Various masking steps may be used to mask and expose appropriate regions when using distinct processes.

Figures 20A, 20B:
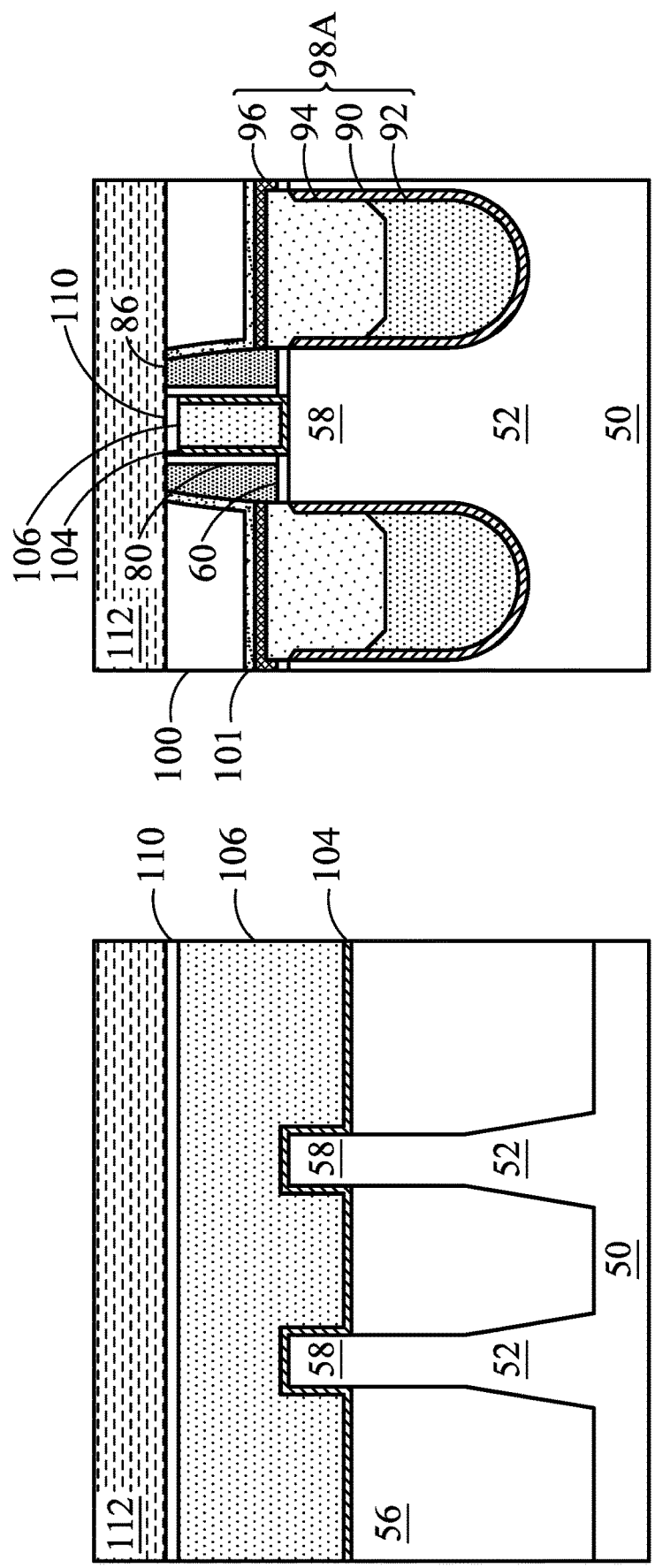

In FIGS. 20A and 20B, a second ILD 112 is deposited over the first ILD 100. In some embodiment, the second ILD 112 is a flowable film formed by a flowable CVD method. In some embodiments, the second ILD 112 is formed of a dielectric material such as PSG, BSG, BPSG, USG, or the like, and may be deposited by any suitable method, such as CVD and PECVD. In accordance with some embodiments, before the formation of the second ILD 112, the gate stack (including a gate dielectric layer 104 and a corresponding overlying gate electrode 106) is recessed, so that a recess is formed directly over the gate stack and between opposing portions of gate spacers 86, as illustrated in FIGS. 20A and 20B. A gate mask 110 comprising one or more layers of dielectric material, such as silicon nitride, silicon oxynitride, or the like, is filled in the recess, followed by a planarization process to remove excess portions of the dielectric material extending over the first ILD 100. The subsequently formed gate contacts 114 (FIGS. 21A-21C) penetrate through the gate mask 110 to contact the top surface of the recessed gate electrode 106.

Figures 21A, 21B:
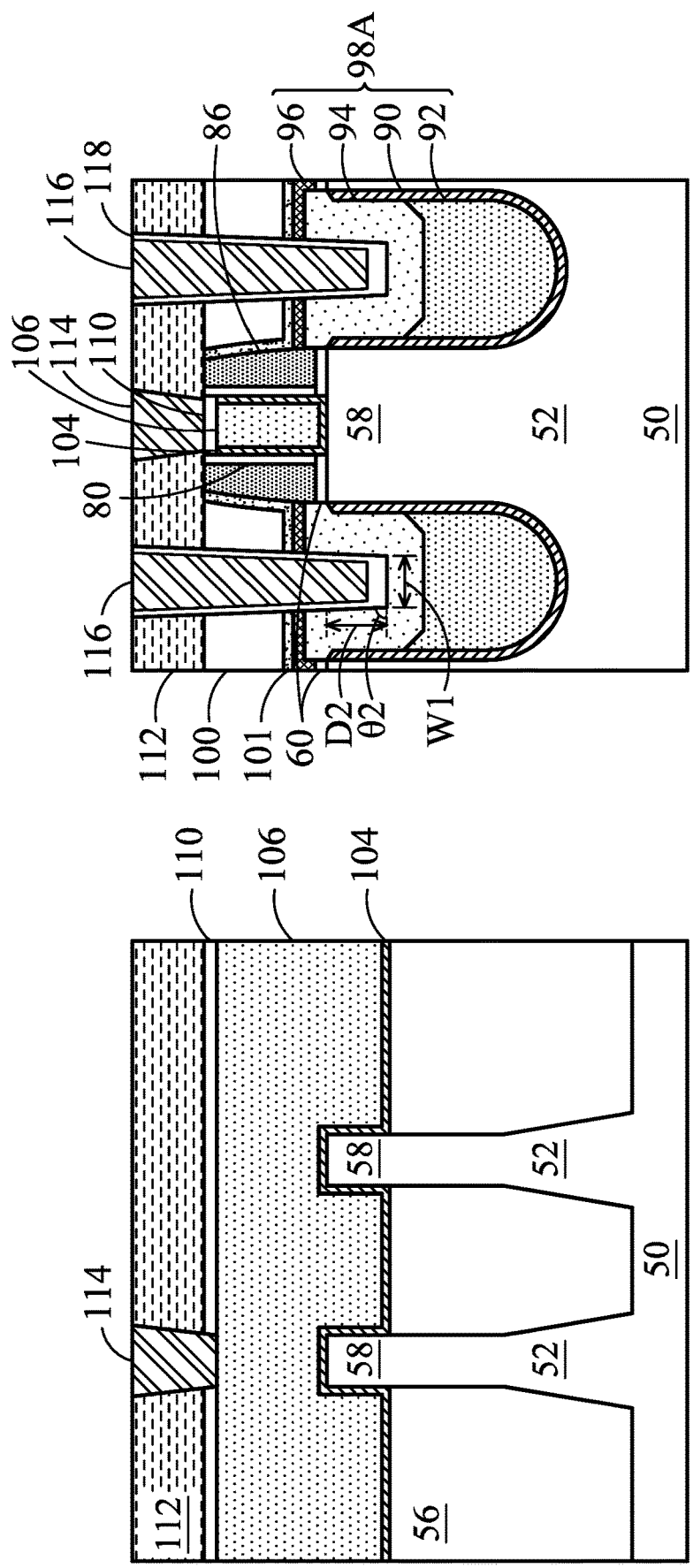
Figure 21C:
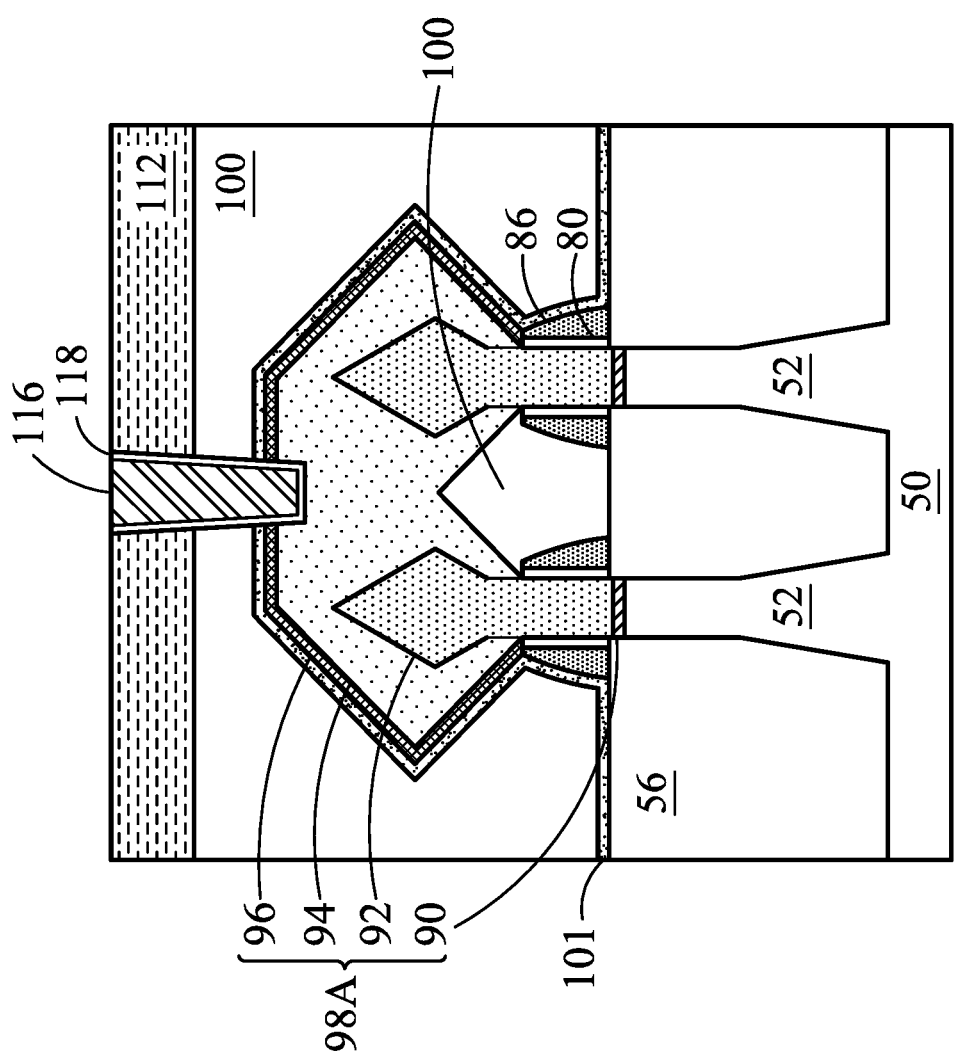

In FIGS. 21A-21C, gate contacts 114 and source/drain contacts 116 are formed through the second ILD 112 and the first ILD 100 in accordance with some embodiments. Openings for the source/drain contacts 116 are formed through the first ILD 100, the second ILD 112, and the fourth source/drain layer 96 or the sixth source/drain layer 97 (not separately illustrated), and openings for the gate contacts 114 are formed through the second ILD 112 and the gate mask 110. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 112. The remaining liner and conductive material form the source/drain contacts 116 and the gate contacts 114 in the openings. As illustrated in FIGS. 21B and 21C, an anneal process may be performed to form a silicide 118 at the interface between the source/drain regions 98A and the source/drain contacts 116 and at the interface between the source/drain regions 98B and the source/drain contacts 116. The source/drain contacts 116 are physically and electrically coupled to the source/drain regions 98A and the source/drain regions 98B, and the gate contacts 114 are physically and electrically coupled to the gate electrodes 106. The source/drain contacts 116 and gate contacts 114 may be formed in different processes, or may be formed in the same process. Although shown as being formed in the same cross-sections, it should be appreciated that each of the source/drain contacts 116 and gate contacts 114 may be formed in different cross-sections, which may avoid shorting of the contacts.

The source/drain contacts 116 may have a depth D2 below an upper surface of the fins 52 less than about 20 nm. Bottom surfaces of the source/drain contacts 116 may have widths W1 greater than about 10 nm. An angle θ2 between outer sidewalls of the source/drain contacts and a line level with the bottom surface of the source/drain contacts may be from about 60° to about 90°. Forming the source/drain contacts 116 extending into the source/drain regions 98A and 98B may increase the contact area of the source/drain contacts 116 with the source/drain regions 98A and 98B, which may further reduce the source/drain resistance ($R_{sd}$).

As described above, forming the source/drain regions 98A including the first source/drain layer 90 formed of doped silicon allows for greater out-diffusion of dopant ions from the first source/drain layer 90 to the channel region 58. This reduces the overlap resistance ($R_{ov}$) between the first source/drain layer 90 and the channel region 58. Moreover, forming a greater volume of the source/drain regions 98A with a higher germanium concentration layer (e.g., the third source/drain layer 94) reduces the source/drain resistance ($R_{sd}$) and the contact resistance ($R_{csd}$) of the source/drain regions 98A and provides greater strain on the channel region 58, which thereby reduces the channel resistance ($R_{ch}$). Accordingly, devices including the source/drain regions 98A have boosted device speed and overall improved device performance.

In accordance with an embodiment, a method includes etching a semiconductor fin to form a first recess; and forming a source/drain region in the first recess, forming the source/drain region including epitaxially growing a first semiconductor material having a first thickness in the first recess, the first semiconductor material being silicon; epitaxially growing a second semiconductor material having a second thickness over the first semiconductor material, the second semiconductor material including silicon germanium; and epitaxially growing a third semiconductor material over the second semiconductor material, the third semiconductor material having a third thickness, a ratio of the third thickness to the first thickness being greater than 5, a ratio of the third thickness to the second thickness being greater than 0.6, and the third semiconductor material having a germanium concentration from 60 to 80 atomic percent, the third semiconductor material having a germanium concentration greater than the germanium concentration of the second semiconductor material. In an embodiment, the first semiconductor material includes boron-doped silicon having a boron concentration greater than $1 \times 10^{20}$ atoms/cm$^3$. In an embodiment, the second semiconductor material includes boron-doped silicon germanium having a germanium concentration from 20 to 60 atomic percent. In an embodiment, the first semiconductor layer and the second semiconductor layer are epitaxially grown at a temperature from 600° C. to 800° C. and the third semiconductor layer is epitaxially grown at a temperature from 300° C. to 600° C. In an embodiment, the first semiconductor material is epitaxially grown at a process pressure from 5 Torr to 50 Torr, the second semiconductor material is epitaxially grown at a process pressure from 5 Torr to 50 Torr, and the third semiconductor material is epitaxially grown at a process pressure greater than 20 Torr. In an embodiment, the method further includes depositing an interlayer dielectric layer over the third semiconductor material; forming an opening extending through the interlayer dielectric layer into the third semiconductor material; and forming a source/drain contact in the opening, the source/drain contact including a silicide. In an embodiment, the method further includes epitaxially growing a fourth semiconductor material over the third semiconductor material, the fourth semiconductor material including silicon germanium having a germanium concentration less than 30 atomic percent, the opening extending through the fourth semiconductor material, the fourth semiconductor material having a fourth thickness, a ratio of the third thickness to the forth thickness being greater than 2.

In accordance with another embodiment, a device includes a fin extending from a substrate; a gate stack over the fin; a source/drain region in the fin adjacent the gate stack, the source/drain region including a first source/drain material having a thickness less than 5 nm, the first source/drain material being silicon; a second source/drain material over the first source/drain material, the second source/drain material having a germanium concentration from 20 to 60 at. % and having a thickness less than 30 nm; and a third source/drain material over the second source/drain material, the third source/drain material having a germanium concentration from 60 to 80 at. % and having a thickness greater than 20 nm. In an embodiment, the source/drain region extends a depth from 20 nm to 80 nm into the fin. In an embodiment, the device further includes a source/drain contact extending partially into the third source/drain material. In an embodiment, the third source/drain material extends from below a topmost surface of the fin to above the topmost surface of the fin, the source/drain contact extending below the topmost surface of the fin by a distance less than 20 nm. In an embodiment, the first source/drain material has a boron dopant concentration greater than $1\times10^{20}$ atoms/cm$^3$, the second source/drain material has a boron dopant concentration greater than $5\times10^{20}$ atoms/cm$^3$, and the third source/drain material has a boron dopant concentration greater than $6\times10^{20}$ atoms/cm$^3$. In an embodiment, the device further includes a fourth source/drain material over the third source/drain material, the fourth source/drain material having a germanium concentration less than 20 at. % and having a thickness less than 10 nm. In an embodiment, the fourth source/drain material has a boron dopant concentration less than $1\times10^{20}$ atoms/cm$^3$. In an embodiment, the device further includes a source/drain contact extending through the fourth source/drain material and partially into the third source/drain material.

In accordance with yet another embodiment, a method includes etching a fin to form a first opening, the fin extending from a substrate; forming a source/drain region in the first opening, forming the source/drain region including epitaxially growing a first semiconductor material in the first opening at a pressure from 5 Torr to 50 Torr, the first semiconductor material having a dopant ion concentration greater than $1\times10^{20}$ atoms/cm$^3$; epitaxially growing a second semiconductor material over the first semiconductor material at a pressure from 5 Torr to 50 Torr, the second semiconductor material having a dopant ion concentration greater than $5\times10^{20}$ atoms/cm$^3$; and epitaxially growing a third semiconductor material over the second semiconductor material at a pressure greater than 20 Torr, the third semiconductor material having a dopant ion concentration greater than $6\times10^{20}$ atoms/cm$^3$; forming an inter-layer dielectric over the source/drain region; forming a second opening exposing the source/drain region by etching the inter-layer dielectric; and forming a source/drain contact extending through the second opening to contact the source/drain region. In an embodiment, forming the source/drain region further includes epitaxially growing a fourth semiconductor material over the third semiconductor material, the fourth semiconductor material having a dopant ion concentration less than $1\times10^{20}$ atoms/cm$^3$. In an embodiment, forming the second opening further includes etching through the fourth semiconductor material and etching partially through the third semiconductor material. In an embodiment, forming the source/drain contact include forming a silicide material in the second opening and depositing a conductive fill material over the silicide material, the silicide material physically contacting the third semiconductor material and the fourth semiconductor material. In an embodiment, the first semiconductor material has a first thickness, the second semiconductor material has a second thickness, the third semiconductor material has a third thickness, the fourth semiconductor material has a fourth thickness, a ratio of the third thickness to the first thickness is greater than 5, a ratio of the third thickness to the second thickness is greater than 0.6, and a ratio of the third thickness to the fourth thickness is greater than 2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a semiconductor fin to form a first recess and a second semiconductor fin to form a second recess; and
   forming a source/drain region in the first recess, wherein forming the source/drain region comprises:
      epitaxially growing a first semiconductor material having a first thickness in the first recess, wherein the first semiconductor material is silicon;
      epitaxially growing a second semiconductor material having a second thickness over the first semiconductor material, the second semiconductor material comprising silicon germanium; and
      epitaxially growing a third semiconductor material over the second semiconductor material, the third semiconductor material having a third thickness, wherein a ratio of the third thickness to the first thickness is greater than 5, wherein a ratio of the third thickness to the second thickness is greater than 0.6, and wherein the third semiconductor material has a germanium concentration from 60 to 80 atomic percent, wherein the germanium concentration of the third semiconductor material is greater than a germanium concentration of the second semiconductor material; and
   forming a second source/drain region in the second recess, wherein forming the second source/drain region comprises:
      epitaxially growing the first semiconductor material in the second recess; and
      epitaxially growing the second semiconductor material in the second recess over the first semiconductor material, wherein the second semiconductor material of the second source/drain region merges with the second semiconductor material of the source/drain region.

2. The method of claim 1, wherein the first semiconductor material comprises boron-doped silicon having a boron concentration greater than $1\times10^{20}$ atoms/cm$^3$.

3. The method of claim 1, wherein the second semiconductor material comprises boron-doped silicon germanium having a germanium concentration from 20 to 60 atomic percent.

4. The method of claim 1, wherein the first semiconductor material and the second semiconductor material are epitaxially grown at a temperature from 600° C. to 800° C. and the third semiconductor material is epitaxially grown at a temperature from 300° C. to 600° C.

5. The method of claim 1, wherein the first semiconductor material is epitaxially grown at a process pressure from 5 Torr to 50 Torr, wherein the second semiconductor material is epitaxially grown at a process pressure from 5 Torr to 50 Torr, and wherein the third semiconductor material is epitaxially grown at a process pressure greater than 20 Torr.

6. The method of claim 1, further comprising:
depositing an interlayer dielectric layer over the third semiconductor material;
forming an opening extending through the interlayer dielectric layer into the third semiconductor material; and
forming a source/drain contact in the opening, the source/drain contact comprising a silicide.

7. The method of claim 6, further comprising epitaxially growing a fourth semiconductor material over the third semiconductor material, the fourth semiconductor material comprising silicon germanium having a germanium concentration less than 30 atomic percent, the opening extending through the fourth semiconductor material, the fourth semiconductor material having a fourth thickness, wherein a ratio of the third thickness to the fourth thickness is greater than 2.

8. A method comprising:
etching a fin to form a first opening and a second fin to form a second opening, the fin and the second fin extending from a substrate;
forming a source/drain region in the first opening, wherein forming the source/drain region comprises:
epitaxially growing a first semiconductor material in the first opening at a pressure from 5 Torr to 50 Torr, the first semiconductor material having a dopant ion concentration greater than $1 \times 10^{20}$ atoms/cm$^3$;
epitaxially growing a second semiconductor material over the first semiconductor material at a pressure from 5 Torr to 50 Torr, the second semiconductor material having a dopant ion concentration greater than $5 \times 10^{20}$ atoms/cm$^3$;
epitaxially growing a third semiconductor material over the second semiconductor material at a pressure greater than 20 Torr, the third semiconductor material having a dopant ion concentration greater than $6 \times 10^{20}$ atoms/cm$^3$; and
epitaxially growing a fourth semiconductor material over the third semiconductor material, the fourth semiconductor material having a dopant ion concentration less than $1 \times 10^{20}$ atoms/cm$^3$;
forming a second source/drain region in the second opening, wherein forming the second source/drain region comprises epitaxially growing the third semiconductor material in the second opening, wherein the third semiconductor material of the second source/drain region merges with the third semiconductor material of the source/drain region;
forming an inter-layer dielectric over the source/drain region;
forming a third opening exposing the source/drain region by etching the inter-layer dielectric; and
forming a source/drain contact extending through the third opening to contact the source/drain region.

9. The method of claim 8, wherein forming the third opening further comprises etching through the fourth semiconductor material and etching partially through the third semiconductor material.

10. The method of claim 9, wherein forming the source/drain contact comprises forming a silicide material in the third opening and depositing a conductive fill material over the silicide material, the silicide material physically contacting the third semiconductor material and the fourth semiconductor material.

11. The method of claim 8, wherein the first semiconductor material has a first thickness, wherein the second semiconductor material has a second thickness, wherein the third semiconductor material has a third thickness, wherein the fourth semiconductor material has a fourth thickness, wherein a ratio of the third thickness to the first thickness is greater than 5, wherein a ratio of the third thickness to the second thickness is greater than 0.6, and wherein a ratio of the third thickness to the fourth thickness is greater than 2.

12. The method of claim 8, wherein the first semiconductor material is silicon, wherein the second semiconductor material has a germanium concentration from 20 to 60 atomic percent (at. %), wherein the third semiconductor material has a germanium concentration from 60 to 80 at. %, and wherein the fourth semiconductor material has a germanium concentration from 10 to 30 at. %.

13. A method comprising:
forming a fin and a second fin extending from a substrate;
forming a gate stack over the fin;
etching the fin to form a first recess in the fin adjacent the gate stack;
depositing a first source/drain material in the first recess, the first source/drain material having a thickness less than 5 nm, wherein the first source/drain material is silicon;
depositing a second source/drain material in the first recess over the first source/drain material, the second source/drain material having a germanium concentration from 20 to 60 atomic percent (at. %) and having a thickness less than 30 nm; and
depositing a third source/drain material over the second source/drain material, the third source/drain material having a germanium concentration from 60 to 80 at. % and having a thickness greater than 20 nm, the third source/drain material having a flat horizontal surface extending from vertically above the fin to vertically above the second fin.

14. The method of claim 13, wherein the fin is etched such that the first recess extends a depth from 20 nm to 80 nm into the fin.

15. The method of claim 13, further comprising:
etching the third source/drain material to form a second recess; and
forming a source/drain contact extending at least partially into the second recess.

16. The method of claim 15, wherein the third source/drain material is etched such that a bottom surface of the second recess is below a topmost surface of the fin by a distance less than 20 nm, and wherein the third source/drain material extends from below the topmost surface of the fin to above the topmost surface of the fin.

17. The method of claim 13, wherein the first source/drain material is deposited with a boron dopant concentration greater than $1 \times 10^{20}$ atoms/cm$^3$, wherein the second source/drain material is deposited with a boron dopant concentration greater than $5 \times 10^{20}$ atoms/cm$^3$, and wherein the third source/drain material is deposited with a boron dopant concentration greater than $6 \times 10^{20}$ atoms/cm$^3$.

18. The method of claim 13, further comprising depositing a fourth source/drain material over the third source/drain material, the fourth source/drain material having a germanium concentration less than 20 at. % and having a thickness less than 10 nm.

19. The method of claim 18, wherein the fourth source/drain material is deposited with a boron dopant concentration less than $1 \times 10^{20}$ atoms/cm$^3$.

20. The method of claim 18, further comprising
etching the third source/drain material and the fourth source/drain material to form a second recess extending through the fourth source/drain material and at least partially into the third source/drain material; and
forming a source/drain contact extending at least partially into the second recess.

\* \* \* \* \*